(12) United States Patent
Berini et al.

(10) Patent No.: US 9,397,241 B2
(45) Date of Patent: Jul. 19, 2016

(54) METAL-INSULATOR-SEMICONDUCTOR DEVICES BASED ON SURFACE PLASMON POLARITONS

(71) Applicant: University of Ottawa, Ottawa (CA)

(72) Inventors: Pierre Simon Joseph Berini, Orleans (CA); Chengkun Chen, Kanata (CA)

(73) Assignee: University of Ottawa, Ottawa (CA)

( * ) Notice: Subject to any disclaimer, the term of this patent is extended or adjusted under 35 U.S.C. 154(b) by 0 days.

(21) Appl. No.: 14/563,780

(22) Filed: Dec. 8, 2014

(65) Prior Publication Data

US 2015/0162462 A1    Jun. 11, 2015

Related U.S. Application Data

(60) Provisional application No. 61/914,119, filed on Dec. 10, 2013.

(51) Int. Cl.

| | |
|---|---|
| *G02B 6/34* | (2006.01) |
| *H01L 31/0232* | (2014.01) |
| *H01L 31/18* | (2006.01) |
| *H01L 31/0236* | (2006.01) |

(Continued)

(52) U.S. Cl.
CPC ............ *H01L 31/02327* (2013.01); *G02B 6/26* (2013.01); *G02B 6/266* (2013.01); *G02B 6/34* (2013.01); *G02F 1/025* (2013.01); *G02F 1/17* (2013.01); *H01L 31/0232* (2013.01); *H01L 31/0236* (2013.01); *H01L 31/02363* (2013.01); *H01L 31/02366* (2013.01); *H01L 31/18* (2013.01); *G02B 6/124* (2013.01); *G02B 6/1226* (2013.01); *G02F 2001/0152* (2013.01); *G02F 2201/302* (2013.01); *G02F 2202/10* (2013.01); *G02F 2203/10* (2013.01); *Y02E 10/50* (2013.01)

(58) Field of Classification Search
None
See application file for complete search history.

(56) References Cited

U.S. PATENT DOCUMENTS

| | | |
|---|---|---|
| 4,249,796 A | 2/1981 | Sincerbox et al. |
| 4,432,614 A | 2/1984 | McNeill et al. |

(Continued)

OTHER PUBLICATIONS

Berini, Pierre, et al., "Long-range surface plasmon-polariton waveguides and devices in lithium niobate", J. Appl. Phys., vol. 101, (2007), 113114-113114(12).

(Continued)

*Primary Examiner* — Minh-Loan Tran
(74) *Attorney, Agent, or Firm* — Schwegman Lundberg & Woessner, P.A.

(57) ABSTRACT

Apparatus and techniques are presented such as can be used for electro-optic modulation and detection or other applications. For example, an optical metal grating is disposed on a thin metal film to couple light from broadside to the metal film as surface plasmon-polariton waves; below the metal film is located a thin insulating layer and a doped semiconductor region forming a metal-insulator-semiconductor structure. The device can be configured to operate as a reflection or transmission modulator, or as a photodetector, for example. Modulating the voltage applied to the metal-insulator-semiconductor structure modulates the carrier concentration in the semiconductor near the insulating layer, which modulates the refractive index of the semiconductor in this region, thus modulating the coupling efficiency to the surface plasmon-polaritons, thus modulating the reflectance and transmittance of the device. Modulated incident light produces a modulated photocurrent under bias which may be detected using electronics.

20 Claims, 22 Drawing Sheets

(51) Int. Cl.

| | |
|---|---|
| *G02B 6/26* | (2006.01) |
| *G02F 1/025* | (2006.01) |
| *G02F 1/17* | (2006.01) |
| *G02B 6/122* | (2006.01) |
| *G02B 6/124* | (2006.01) |
| *G02F 1/015* | (2006.01) |

(56) References Cited

U.S. PATENT DOCUMENTS

| | | | |
|---|---|---|---|
| 4,451,123 | A | 5/1984 | McNeill et al. |
| 4,915,482 | A | 4/1990 | Collins et al. |
| 4,948,225 | A | 8/1990 | Rider et al. |
| 4,971,426 | A | 11/1990 | Schildkraut et al. |
| 5,075,796 | A | 12/1991 | Schildkraut et al. |
| 5,155,617 | A | 10/1992 | Solgaard et al. |
| 5,157,541 | A | 10/1992 | Schildkraut et al. |
| 5,625,729 | A | 4/1997 | Brown |
| 6,442,321 | B1 | 8/2002 | Berini |
| 6,741,782 | B2 | 5/2004 | Berini |
| 6,801,691 | B2 | 10/2004 | Berini |
| 6,823,111 | B2 | 11/2004 | Jette et al. |
| 6,914,999 | B2 | 7/2005 | Breukelaar et al. |
| 7,026,701 | B2 | 4/2006 | Scales et al. |
| 7,043,134 | B2 | 5/2006 | Berini et al. |
| 7,109,739 | B2 | 9/2006 | Gothoskar et al. |
| 7,151,789 | B2 | 12/2006 | Jette et al. |
| 7,262,852 | B1 | 8/2007 | Gunn, III et al. |
| 7,773,228 | B1* | 8/2010 | Hollingsworth ..... A61B 5/0059 250/338.1 |
| 7,973,933 | B2* | 7/2011 | Homola ............... G01N 21/553 356/445 |
| 2002/0021445 | A1* | 2/2002 | Bozhevolnyi ......... B82Y 20/00 356/445 |
| 2008/0279233 | A1* | 11/2008 | Carras .................. H01S 5/1228 372/26 |
| 2010/0014808 | A1* | 1/2010 | Flammer ............... B82Y 20/00 385/37 |
| 2010/0110525 | A1* | 5/2010 | Gan ........................ G02B 5/008 359/288 |
| 2012/0002203 | A1* | 1/2012 | Romanato ........... G01N 21/553 356/369 |

OTHER PUBLICATIONS

Berini, Pierre, "Surface plasmon photodetectors and their applications", Lasers & Photonics Reviews 8, No. 2, (2014), 197-220.

Cai, Wenshan, et al., "Compact high-speed and power-efficient electrooptic plasmonic modulators", Nano Lett., vol. 9, (2009), 4403-4441.

Dionne, Jennifer A., et al., "PlasMOStor: a metal-oxide-Si field effect plasmonic modulator", Nano Lett., vol. 9, (2009), 7 pgs.

Evans, A. F., "Measurement of the electrically induced refractive index change in silicon for wavelength ?=1.3 ?m using a Schottky diode", Appl. Phys. Lett., vol. 56, (1990), 212-214.

Gagnon, Guy, et al., "Thermally Activated Variable Attenuation of Long-Range Surface Plasmon-Polariton Waves", J. Lightw. Technol., vol. 24, (2006), 4391-4402.

Hassan, Sa'ad, et al., "Fabrication of a plasmonic modulator incorporating an overlaid grating coupler", Nanotechnology. vol. 25, 495202, (2014), 10 pgs.

Krasavin, A.V., et al., "Photonic Signal Processing on Electronic Scales: Electro-Optical Field-Effect Nanoplasmonic Modulator", Phys. Rev. Lett., vol. 109, (2012), 053901(1)-053901(5).

Melikyan, A., et al., "Surface plasmon polariton absorption modulator", Opt. Express, vol. 19, (2011), 8855-8869.

Nikolajsen, Thomas, et al., "In-line extinction modulator based on long-range surface plasmon polaritons", Opt. Corn., vol. 244., (2005), 455-459.

Nikolajsen, Thomas, et al., "Surface plasmon polariton based modulators and switches operating at telecom wavelengths", Appl. Phys. Lett., vol. 85, (2004), 5833-5835.

Olivieri, Anthony, et al., "Plasrnonic nanostructured metal-oxide-semiconductor reflection modulators", Nano Letters vol. 15, Issue 4, (Apr. 2015), 6 pgs.

Sayil, S., et al., "All-silicon optical contactless testing of integrated circuits", Int. J. Electronics, vol. 89, (2002), 537-547.

Sayil, Selahattin, et al., "Comparison of Contactless Measurement and Testing Techniques to a New All-Silicon Optical Test and Characterization Method", IEEE Trans. Instr. Meas., vol. 54, (2005), 2082-2089.

Sorger, V.J., et al., "Ultra-compact silicon nanophotonic modulator with broadband response", Nanophotonics, vol. 1, (2012), 6 pgs.

Thomas, Roney, et al., "Plasmonic Modulators for Near-Infrared Photonics on a Silicon-on-Insulator Platform", IEEE. J. Sel. Top. Quant. Electr., vol. 19, 4601708, (2013), 8 pgs.

Zhu, Shiyang, et al., "Electro-absorption modulation in horizontal metal-insulator-siliconinsulator-metal nanoplasmonic slot waveguides", Appl. Phys. Lett., vol. 99,, (2011), 3 pgs.

Zhu, Shiyang, "Phase modulation in horizontal metal-insulatorsilicon-insulator-metal plasmonic waveguides", Opt. Express, vol. 21, (2013), 8320-8330.

Zhu, Shiyang, et al., "Theoretical investigation of silicon MOS-type plasmonic slot waveguide based MZI modulators", Opt. Express, vol. 18, (2010), 27802-27819.

\* cited by examiner

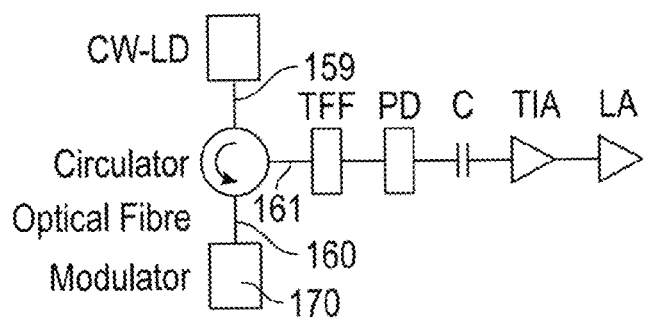
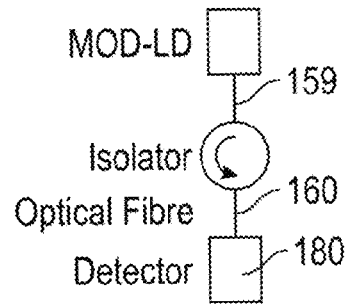
FIG. 1A
FIG. 1B
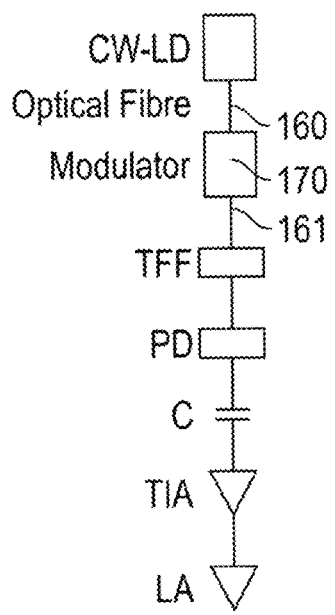
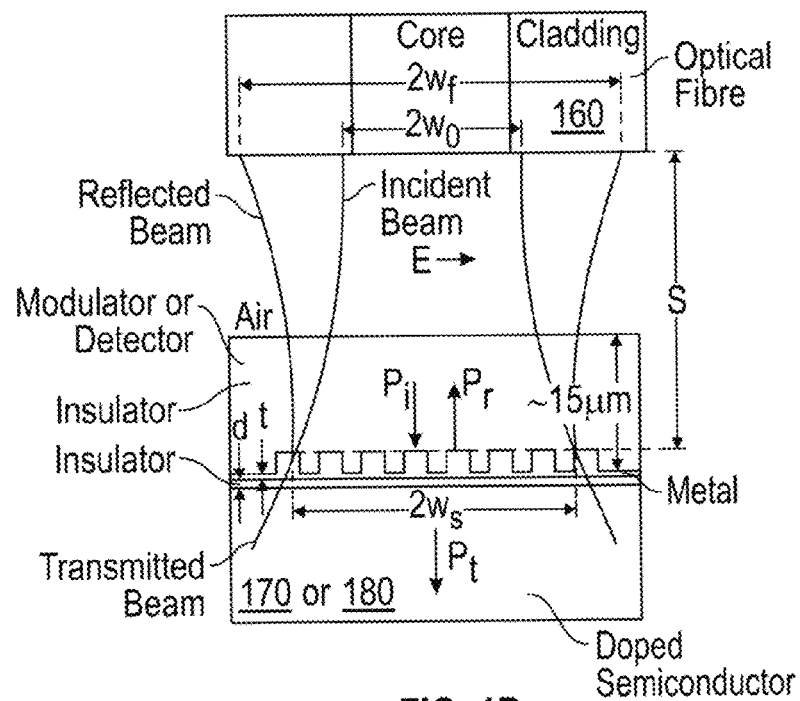
FIG. 1C
FIG. 1D

METAL-INSULATOR-SEMICONDUCTOR DEVICES BASED ON SURFACE PLASMON POLARITONS

CLAIM OF PRIORITY

This patent application claims the benefit of priority of Berini et al., U.S. Provisional Patent Application Ser. No. 61/914,119, titled "METAL-INSULATOR-SEMICONDUCTOR MODULATOR AN DETECTOR BASED ON SURFACE PLASMON POLARITONS," filed on Dec. 10, 2013, which is hereby incorporated by reference herein in its entirety.

BACKGROUND

Generally, modulator and photodetector devices that use surface plasmon polariton (SPP) modes can be classified along two distinct architectures. The first architecture can be based on the phenomenon of attenuated total reflection (ATR) and the second architecture can be based on the propagation of surface plasmon polaritons (SPPs) along an appropriate waveguide.

ATR-based devices generally include coupling of an out-of-plane optical beam to SPPs propagating on a metal surface, such as with the aid of a prism or a grating. At a specific angle of incidence, which can depend on one or more of the optical wavelength, the materials used, and the particular geometry of the device, coupling to SPPs can be enhanced (e.g., maximized) and a drop in the power reflected from the metal surface can be observed. ATR-based modulators can make use of this attenuated reflection phenomenon. For example, at least one of the optical parameters of one of the dielectrics or semiconductors bounding the metal structure can be varied (e.g., electrically or otherwise), such as to shift the angle of incidence where enhanced (e.g., maximized) coupling to SPPs occurs. In an illustrative example, electrically shifting the angle of maximum coupling can modulate the intensity of reflected light. See, for example, U.S. Pat. Nos. 5,625,729; 5,155,617; 5,157,541; 5,075,796; 4,971,426; 4,948,225; 4,915,482; 4,451,123; 4,432,614; and 4,249,796, the contents of each of which are hereby incorporated herein by reference.

ATR-based photodetectors can make use of attenuated reflection phenomenon along with detecting a photocurrent generated in the structure via Schottky barrier photo-emission or through the generation of electron-hole pairs in a semiconductor bounding the metal structure. In one approach, ATR-based modulators or photodetectors can be implemented using a prism to couple the incident optical beam to SPPs. However, such configurations are generally bulky and not suitable to mass-manufacturing. In another approach, ATR-based modulators or photodetectors can be implemented using a grating to couple the incident optical beam to SPPs. However, such a grating configuration generally does not provide suitable performance (e.g., electrical or optical), such as would require impractical drive voltages or drive currents, or having large insertion loss, low modulation depth or responsivity, or requiring materials that are not yet available for mass-manufacturing.

In other examples, modulators and photodetectors can be implemented using surface plasmon waveguides. For example, metal stripe long-range surface plasmon waveguides and integrated passive elements such as splitters, Mach-Zehnder interferometers, couplers and Bragg gratings can be implemented. See, for example, U.S. Pat. Nos. 6,442,321; 6,914,999; 6,801,691; 6,741,782; 6,823,111; and 7,151,789. Such structures can be used to implement modulators. See, for example, U.S. Pat. Nos. 6,914,999 and 7,043,134. Also see, for example, U.S. Pat. No. 7,026,701 including a photodetector. Short-range surface plasmon waveguides comprising metal claddings can be used to implement modulators based on silicon and indium tin oxide. Such waveguide-based modulators and photodetectors are generally suitable for end-fire excitation (e.g., butt-coupling), but are generally not well suited to surface (e.g., broadside) excitation.

U.S. Pat. No. 7,109,739 mentions optical components and an apparatus for testing silicon on insulator (SOI) wafers bearing mixed integrated optoelectronic and electronic circuits; the optical components include a dielectric prism or grating coupler designed to excite SOI waveguides, and the electrical test points are formed conventionally as metallic contact pads. U.S. Pat. No. 7,262,852 mentions a method for testing wafers bearing integrated optical or optoelectronic circuits, based on aligning an input beam to various alignment features and couplers defined on a wafer.

In one approach for optical non-contact testing of silicon electronic wafers, silicon photodiodes are used for receiving optical data on-wafer at photon energies above the bandgap of silicon, and avalanche diodes were used as light emitting diodes emitting visible light for sending optical data off wafer. However, such an approach can have disadvantages, because it is susceptible to cross-talk, the optical output power emitted by the light emitting diode is very weak, and large voltages are required to drive the emission.

Overview

In an example, a device can include a metal grating coupler for optical coupling to a metal-insulator-semiconductor structure for guiding surface plasmon-polariton waves. For example, the device can include a thin insulating layer, a doped semiconductor substrate, and an electrically-conductive film layer (e.g., a thin metal film) on the insulating layer completing the metal-insulator-semiconductor structure. The device can include conductive (e.g., metal) bumps on the thin metal film, such as arranged periodically as a grating and dimensioned so that p-polarized light incident thereon at a wavelength in a predetermined range couples to surface plasmon-polaritons propagating along the thin metal film with fields localized along the bottom surface of the metal film and that penetrate at least partly into the semiconductor. The device can include a transparent insulator as a protective coating, an electrical contact or other interconnect to provide an electrical coupling to the metal-insulator-semiconductor structure, an optical coupler or other feature configured to inject p-polarized light incident onto the grating, and a collector configured to capture light reflected or transmitted from the metal-insulator-semiconductor structure.

In an example, a device, such as including one or aspects above or discussed elsewhere herein, can be operated or otherwise configured as an optical reflection or transmission modulator, such as by driving a metal-insulator-semiconductor structure into accumulation or inversion through an applied modulating voltage. In this manner, in either case, a high density of charge carriers (electrons or holes) can accumulate in the semiconductor near the interface with the insulator, such as modulating the refractive index of the semiconductor in this region via the carrier refraction effect. This in turn can modulate the coupling efficiency of incident p-polarized light to the surface plasmon-polariton waves, thereby modulating the light reflected and transmitted from the device.

In an example, a device, such as including one or more aspects above or discussed elsewhere herein, can be operated or otherwise configured as a photodetector, such as by applying a bias voltage to a metal-insulator-semiconductor structure, and illuminating a grating with p-polarized light, thereby exciting the surface plasmon-polariton waves. This in turn can induce the injection of carriers from the metal into the semiconductor, leading to a detectable photocurrent. For example, a maximum modulation and the maximum photodetection can occur over a wavelength range determined by the grating, waveguide and metal-insulator-semiconductor structure configuration.

Examples described herein can be integrated in semiconductor wafers, particularly Si wafers, such as for applications involving wafer functional test, for optical communication applications, or for other applications where modulators or photodetectors are used. For example, devices described herein can be configured for broadside input of light such that multiple devices can be integrated on the same surface and arrays of optical beams or optical fibers can be used to couple light into or out of such devices, such as providing a parallel communications architecture.

In an example, devices described herein can be used to provide a non-contact semiconductor wafer probing configuration for manufacturing applications. For example, such a configuration can significantly reduce a number of contact electrical probes in a probe card, therefore increasing probe card reusability or reliability as compared with generally-available probe cards having only contact electrical probes. Such a non-contact configuration can also reduce energy consumption for wafer functional test.

In an example, devices described herein can be used as a modulator or as a photodetector depending simply on the arrangement of the electrical connections and the optical input or output coupling. In this manner, the same or a similar device configuration could be used both as a modulator and as a photodetector. Devices described herein can also be used for other applications such as high-throughput parallel optical interconnects, or high-throughput biosensors.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 1A illustrates generally an example that can include a device configured as a modulator with an input/output optical fiber connected to a circulator, a continuous wave laser diode (CW-LD), a thin film filter (TFF), a photodetector (PD), a capacitor (C), a transimpedance amplifier (TIA) and a limiting amplifier (LA);

FIG. 1B illustrates generally an example that can include a device configured as a photodetector with an input optical fiber connected to an isolator and an intensity modulated laser diode (MOD-LD);

FIG. 1C illustrates generally an example that can include a device configured as a modulator with an input optical fiber connected to a continuous wave laser diode (CW-LD), and an output optical fiber connected to a thin film filter (TFF), a photodetector (PD), a capacitor (C), a transimpedance amplifier (TIA) and a limiting amplifier (LA);

FIG. 1D illustrates generally a side view of an example of a device that can be configured as a modulator or photodetector, along with an optical fiber, and incident and reflected beams;

Figure 2A:
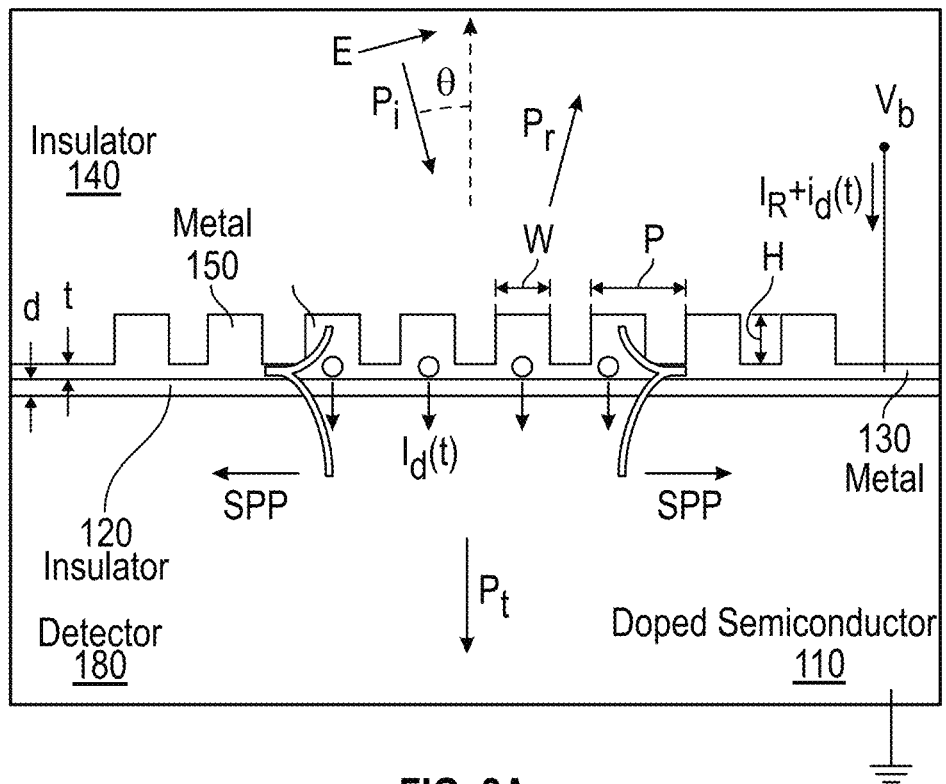
FIGS. 2A and 2B illustrate generally side views of examples that can include a device configured as a photodetector or modulator, respectively, each implemented as a metal-insulator-semiconductor structure.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Examples herein can include one or more devices configured as a modulator, in reflection, transmission, or both simultaneously, or as a photodetector, depending on the arrangement of the optical input/output coupling configuration and depending on the voltages applied to the device. Optical input and output coupling configurations may include generally-available apparatus and techniques used in the optical technical domain to manage confined light, such as, for example, optical fibers or dielectric waveguides, or free-space beams such as coupled to or from the devices described herein using lenses, beamsplitters, or mirrors. A Gaussian beam, emerging from a lens system or from an optical fiber, for example, is suitable for use as an input to device configurations described herein.

Optical Coupling Apparatus and Techniques for Input or Output:

FIG. 1A illustrates generally an example of a modulator device 170 in an arrangement suitable for reflection modulation. A polarized continuous wave laser diode (CW-LD), emitting e.g. near $\lambda_0$=1550 nm or $\lambda_0$=1310 nm, is connected via a polarization-maintaining single-mode optical fiber (PM-SMF) 159 to a polarization-maintaining circulator. The output of the circulator is connected to another PM-SMF 160 which is aligned perpendicularly to the modulator device 170. The modulator device 170 is driven with a time-dependent voltage such that its reflectance varies with time thereby modulating in intensity the incident light. The modulated reflected light is input to the PM-SMF 160 where it propagates in the direction opposite to that of the incident light, and is directed by the circulator to a standard single mode fiber (SMF) 161, then to a bandpass thin film filter (TFF) and a photodetector (PD). The photodetector generates a photocurrent which includes continuous and time-varying components. The photocurrent is directed to a capacitor (C) which blocks the continuous component but passes the time-varying component. A transimpedance amplifier (TIA) amplifies the time-varying component, which then drives a limiting amplifier (LA) to produce standard electronic signal levels commensurate with the modulation applied to the device 170. The polarization of the light emitted by the CW-LD is aligned with the PM-SMFs 159, 160, and the circulator to ensure that the light incident onto the modulator device 170 is p-polarized. The TFF is selected such that its passband is aligned spectrally with the emission wavelength of the CW-LD, and is used to reject unwanted (stray) light at other wavelengths that may be present (the TFF may be eliminated if no stray light is present).

FIG. 1B illustrates generally an example of a detector device 180 in an arrangement suitable for photodetection. A polarized intensity modulated laser diode (MOD-LD), emitting, e.g., near $\lambda_0$=1550 nm or $\lambda_0$=1310 nm, is connected via a PM-SMF 159 to a polarization-maintaining isolator. The output of the isolator is connected to another PM-SMF 160 which is aligned perpendicularly to the device 180. The device 180 is biased such that it generates a photocurrent proportional to the incident optical power, and which may have continuous and time-varying components. The photocurrent provided by the detector device 180 can then be input into electronics to amplify and produce electronic signal levels having specified characteristics, such as according to one or more standards (e.g., C, TIA, LA). The polarization of the light emitted by the MOD-LD is aligned with the PM-SMFs 159, 160 and the isolator to ensure that the light incident onto the device 180 is p-polarized. The isolator is used to protect the MOD-LD from reflections.

FIG. 1C illustrates generally an example of a modulator device 170 in an example arrangement suitable for transmission modulation. A polarized continuous wave laser diode (CW-LD), emitting, e.g., near $\lambda_0$=1550 nm or $\lambda_0$=1310 nm, is connected to a PM-SMF 160 which is aligned perpendicularly to the device 170. The device 170 is driven such that its transmittance varies with time thereby modulating in intensity the incident light. The modulated transmitted light is input to a standard SMF 161, then directed to a bandpass thin film filter (TFF) and a photodetector (PD). The photodetector generates a photocurrent which includes continuous and time-varying components. The photocurrent is directed to a capacitor (C) which blocks the continuous component but passes the time-varying component. A transimpedance amplifier (TIA) amplifies the time-varying component, which then drives a limiting amplifier (LA) to produce electronic signal levels commensurate with the modulation applied to the device 170. The polarization of the light emitted by the CW-LD is aligned with the PM-SMF 160 to ensure that the light incident onto the device 170 is p-polarized. The TFF is selected such that its passband is aligned spectrally with the emission wavelength of the CW-LD, and is used to reject unwanted (stray) light at other wavelengths that may be present (the TFF may be eliminated if no stray light is present). An isolator may be inserted between the device 170 and the CW-LD, as in FIG. 1B in order to protect the CW-LD from unwanted reflection. The arrangements of FIGS. 1A and 1C may be combined to obtain two modulated signals by exploiting the simultaneous modulation of the reflectance and transmittance of the device (170).

The optical fiber 161 may be as short as a few cm or as long as several thousand km, or have any length deemed practical for the intended application.

FIG. 1D shows a cross-section in expanded view of the PM-SMF 160 and a an example of a device that can be configured as a modulator 170 or as a photodetector 180, as described in the arrangements of FIGS. 1A through 1C, for example. The PM-SMF 160 is aligned perpendicularly to the top surface of the device such that the beam emerging from the PM-SMF is p-polarized, (e.g., has its electric field (E) oriented in the direction shown (in the plane of the figure)), and is normally incident onto the device. The beam emerging from the PM-SMF 160 can be modelled accurately as a Gaussian beam. The PM-SMF 160 could be selected, for example, as a PANDA fiber with a core diameter of ~8 µm for operation at an optical wavelength of $\lambda_0$~1550 nm, in which case the diameter and Rayleigh range of the emerging beam are $2w_0$~10.4 µm and $z_0$~54.8 µm where $z_0=\pi w_0^2/\lambda_0$.

The spacing between the PM-SMF and the device could be selected such that s=$z_0$, in which case the diameter of the incident beam at the top surface of the metal portion of the device is $2w_s$~15 µm, and the diameter of the reflected beam at the surface of the PM-SMF is $2w_f$~23.3 µm, where $w_s=w_0\sqrt{1+(s/z_0)^2}$ and $W_f=w_0\sqrt{1+(2s/z_0)^2}$. The transmittance of the reflected beam into the PM-SMF is then ~0.76 for a corresponding coupling loss of ~1.2 dB. The portion of the light that is not reflected by the device is transmitted as the beam propagating through the doped semiconductor, and could be collected by a SMF 161 in the arrangement of FIG. 1C, if desired. The powers of the incident, reflected and transmitted beams are denoted $P_i$, $P_r$, and $P_t$, respectively. An intervening material instead of air could be inserted between the PM-SMF 160 and the device, such as an optical bonding material, or such an intervening material could be placed in physical contact with the device. Arrangements of optical elements other than those shown in FIGS. 1A through 1D may be used to interface with the device, so the examples of FIGS. 1A to 1D are illustrative in nature.

A bias circuit can be coupled to the modulator 170 or detector 180 such as to apply a voltage between a metal region and a semiconductor region. In an example, such as in relation to the modulator device 170, a modulator circuit can be used (in addition to the bias circuit) to apply a time-varying signal between the metal region and the semiconductor region, such as to modulate the index of refraction of a semiconductor region of the modulator device 180.

Figure 2B:
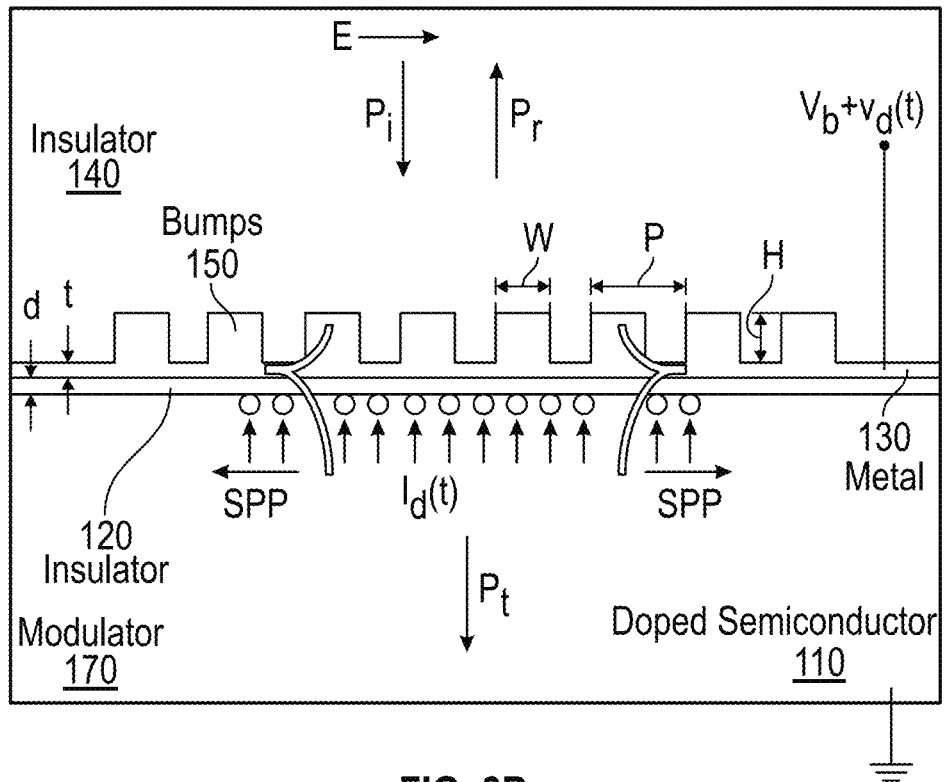

Grating Coupler and SPP Waveguide Structure:

FIGS. 2A and 2B illustrate generally side views of examples that can include a device configured as a photodetector or modulator. The device, whether used as a photodetector 180 or as a modulator 170, generally includes the same structure, comprising a waveguide for guiding SPPs comprising a thin metal film 130 of thickness t and complex refractive index $n_3-jk_3$, on a thin insulating layer 120 of thickness d and refractive index $n_2$, on doped semiconductor 110 of refractive index $n_1$. The metal film 130 is attached or adhered to the insulating layer 120 during fabrication. The structure may include a cover insulating layer 140 of refractive index $n_4$. The imaginary parts of the refractive index of the insulators 120, 140 and the semiconductor 110 can be taken into account but are generally negligible at the optical wavelengths of interest.

Metal bumps 150 of width W and thickness H, are arranged periodically with period P, forming a metal grating that is contiguous with the metal film 130. The grating is invariant out of the plane, (e.g., along the direction out of the page). The dimensions of the grating 150 W, H, P, of the metal film 130, t, and of the insulator 120, d, are selected such that perpendicularly incident p-polarized light of a wavelength in a predetermined range couples to SPPs propagating along the metal film 130 with fields localized along the bottom surface of this film 130, as depicted in FIGS. 2A and 2B, and that penetrate into the doped semiconductor region 110.

The grating is defined by the number of metal bumps 150, each of width W and height H, defining a unit cell of period P. A p-polarized Gaussian beam launched above the structure from the broadside direction is incident onto the grating at its center, and couples into SPPs propagating in the lateral directions as sketched. The grating period P is selected to satisfy the following momentum conservation condition:

$$P = m\lambda_0/(n_{eff,a} n_4 \sin\theta) \quad (1)$$

where m is the (integer) order of the grating, $n_{eff,a}$ is the average effective refractive index of the SPP propagating along the structure including the grating, $n_4$ is the refractive index of the medium bounding the structure on top, and θ is the angle of incidence of the incident beam, as sketched in FIG. 2A, which we set to θ=0° for broadside excitation. Choosing m=1 for the lowest grating order, and approximating $n_{eff,a}$ by $n_{eff}$, which is the effective refractive index of the SPP localized along the bottom of the metal film 130 in the absence of the grating, Eq. (1) simplifies to the following approximate relation:

$$P \approx \lambda_0/n_{eff} \quad (2)$$

The period given by the above serves as a general guide regarding selecting an appropriate period, P, for the grating. The number of grating bumps or the grating dimensions can be further determined to achieve desired performance through electromagnetic modeling using a numerical method such as the finite element method (FEM) or the finite-difference time-domain (FDTD) method, by simulating the beam incident into the structure and altering its dimensions such that coupling into SPPs is observed.

Modulation:

Referring to FIGS. 2A and 2B, the metal-insulator-semiconductor structure of the device comprises the metal film 130 with contiguous metal grating bumps 150, the insulating layer 120, and the doped semiconductor 110. Applying a voltage $V_b+v_d(t)$ relative to ground, as sketched in FIG. 2B, where $V_b$ is a DC bias voltage and $v_d(t)$ is a time-dependent voltage carrying, e.g., data, will induce associated electric fields throughout the structure, which in turn causes carriers to accumulate in the doped semiconductor 110 near the insulating layer 120, commensurate with charging according to $Q=C(V_b+v_d(t))$, where C is the capacitance of the structure. The structure can be driven into accumulation or inversion depending on the polarity of the applied voltage (relative to ground), and on the type of doping used for the semiconductor. For the case of p-type doping, negative voltages induce accumulation whereas positive voltages induce inversion, and for the case of n-type doping positive voltages induce accumulation whereas negative voltages induce inversion. Accumulation or inversion results in a large increase in carrier density (electrons or holes) within a thin region of the semiconductor near the insulator.

Figure 3A:
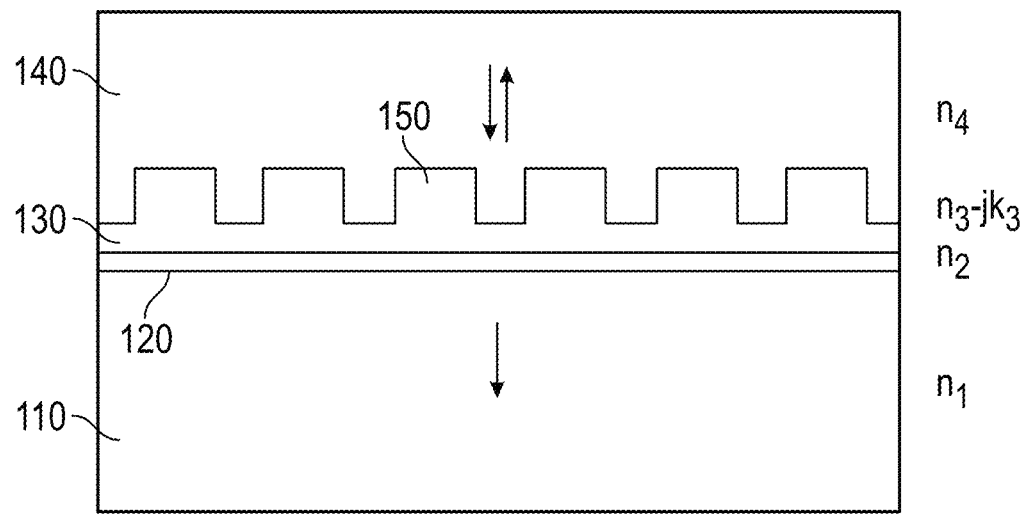
FIGS. 3A and 3B illustrate generally side views of a device configured as a modulator, comprising a metal-insulator-semiconductor structure, with voltages $v_d(t)=0$ in FIG. 3A and $v_d(t)=V_0$ in FIG. 3B, applied.
Figure 3B:
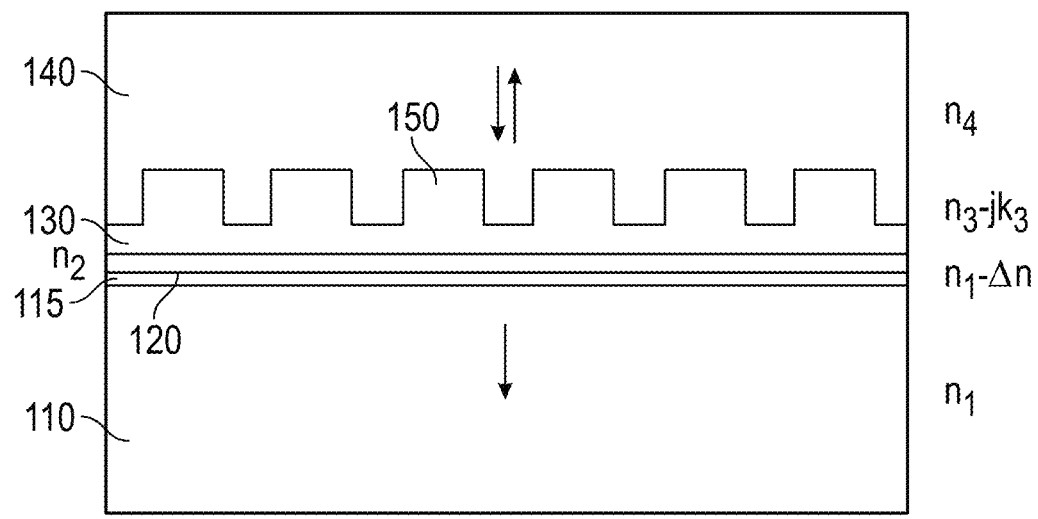
Figure 4:
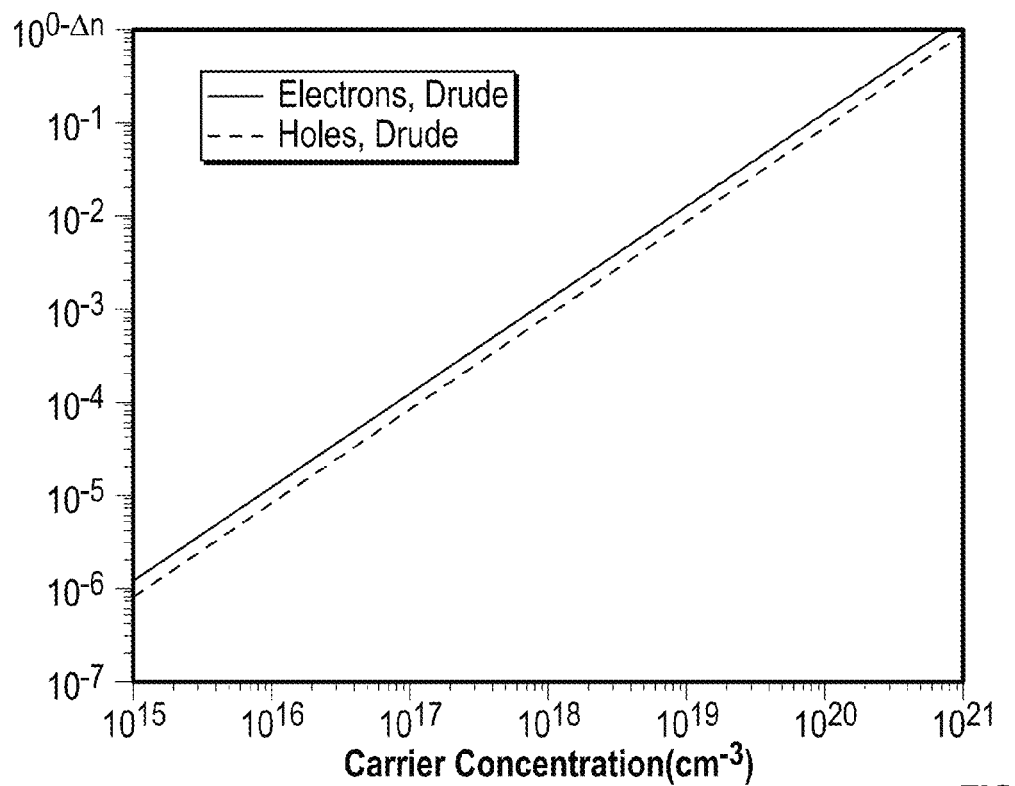
FIG. 4 includes an illustrative example of a refractive index change determined with respect to carrier concentration in Si using a Drude model.

A change in carrier density results in a change in refractive index within a semiconductor. FIG. 3A illustrates generally a refractive index distribution throughout the structure without the application of a voltage, and FIG. 3B shows a refractive index distribution under the application of, for example, a DC voltage. Application of a voltage thus results in a reduction in the real part of the refractive index of the semiconductor ($n_1$), within a thin region 115 near the insulator, by an amount Δn, as sketched in FIG. 3B. A Drude model can be used, such as to obtain the plot shown in the illustrative example of FIG. 4, illustrating a negative change in refractive index (−Δn) in, e.g., Si, as a function of electron and hole concentration. For example, a refractive index of Si decreases by about 0.5 for an increase in hole or electron concentration of about $4 \times 10^{20}$ cm$^{-3}$.

Figure 5A:
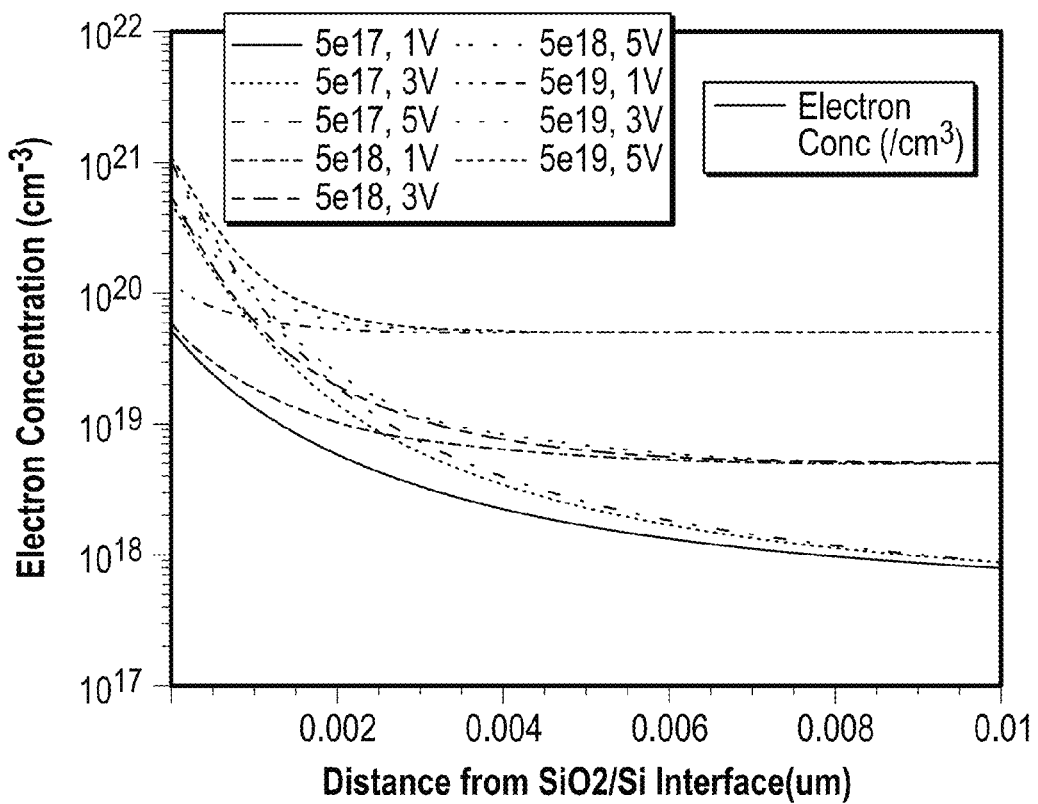
FIGS. 5A and 5B include illustrative examples of electron concentration near an $SiO_2$/Si interface for a Cu/$SiO_2$/n-Si MOS structure as a function of n-type doping level and applied voltages for an $SiO_2$ layer thickness of d=2 nm in FIG. 5A, and an $SiO_2$ layer thickness of d=4 nm in FIG. 5B.
Figure 5B:
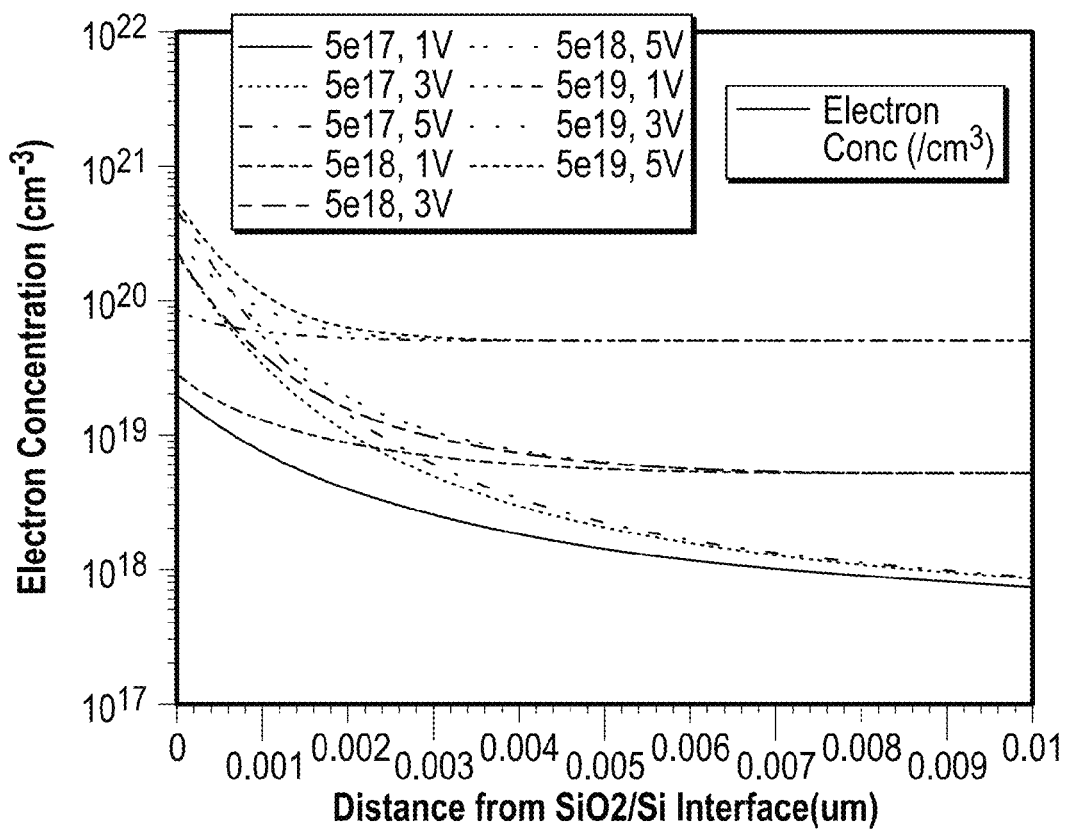

The carrier concentration in a metal-insulator-semiconductor structure can be computed as a function of applied voltage by solving Poisson's equation using, for example, numerical tools. A commercial tool was employed to model an illustrative example of a metal-oxide-semiconductor (MOS) structure, specifically a Cu/SiO$_2$/Si MOS structure with n-type Si doping, as it is driven into accumulation. FIGS. 5A and 5B include illustrative examples of simulated electron concentration from the SiO$_2$/Si interface into the Si, as a function of doping level and applied voltage, for an SiO$_2$ thickness of d=2 nm (e.g., FIG. 5A), and an SiO$_2$ thickness of d=4 nm (e.g., FIG. 5B)). Electron concentrations of $10^{20}$ to $10^{21}$ cm$^{-3}$ can be produced over about 1 nm using modest accumulation voltages and reasonable Si doping levels (similar hole concentrations are achievable using accumulation voltages of opposite polarity on p-type Si).

A device according to various examples described herein can be configured as a reflection or a transmission modulator 170 (or both), such as by modulating the carrier concentration in the semiconductor region near the insulator 115, by driving the structure into accumulation (e.g., FIG. 5A or 5B) or inversion via the applied voltage $V_b+v_d(t)$, thus modulating the refractive index therein 115 (e.g., FIG. 4), which modulates $n_{eff}$ of the SPPs propagating along the metal film 130, which modulates the coupling efficiency of the grating (Eq. (2), and thus the reflectance and transmittance (e.g., FIG. 2B).

Detection:

A device according to various examples described herein can be configured as a photodetector 180 by applying a DC bias voltage $V_b$ to the metal-insulator-semiconductor structure, and illuminating the grating with modulated p-polarized light carrying power $P_i(t)$, thereby exciting SPPs localized along the metal film 130, which in turn induces the injection of carriers from the metal into the semiconductor, leading to the photocurrent $i_d(t)$ (which adds to the dark current $I_R$ generated by the bias voltage $V_b$), as sketched in FIG. 2A. The photocurrent is created by the absorption of SPPs in the metal film 130 leading to hot carriers therein (electrons and holes), some of which have sufficient energy to overcome the potential barrier of the insulating region 120 and tunnel into the semiconductor 110.

Materials:

Suitable materials for the metal film 130 or grating bumps 150 of the device shown in examples discussed herein can include good conductors such as metals, semi-metals, highly doped semiconductors, or any other material that behaves optically like a metal, for example. Accordingly, the word "metal" as used in this document need not refer literally or restrictively to metallic materials only. A construction for the metal film 130 can include a single metal or a combination of metals (e.g., an alloy or a laminate), selected from the group of, for example, Au, Ag, Cu, Al, TiN, TaN (or other nitrides), metal silicides, metal oxides (e.g., ITO), or Cr, Ti, Ni, Mo. A combination of metals can be used, such as if a particular layer, portion, or constituent is used to promote adhesion or act as a diffusion barrier, and another layer, portion, or constituent is used, for example, for its optical performance. Doped semiconductor materials 110 can be used, and can include Si or poly-Si, Ge, GaAs, InP, GaN, alloys involving these materials, or other inorganic or organic semiconductor materials. Insulator 140, 120 materials can include silicon dioxide, silicon nitride, silicon oxynitride, HfO$_2$, other oxides or nitrides, or polymers, for example.

In an example, a high refractive index material with a high electric field breakdown, such as silicon nitride, HfO$_2$, or related materials, can be used for an insulator (e.g., thin insulator layer 120), such as to increase the overlap of the surface plasmon-polariton fields with a semiconductor region 115 to be modulated. This can render the surface plasmon-polariton waves more sensitive to changes in refractive index in this region, and can reduce the drive voltage used to achieve modulation.

SPP Waveguide Aspects:

Devices according to examples herein include an SPP waveguide structure. This waveguide structure can be considered in the absence of the grating bumps 150 in order to determine and illustrate appropriate dimensions for supporting SPPs with fields localized along the bottom surface of the metal film 130. A transfer matrix method can be used for the modal computations. The free-space operating wavelength was set, for illustrative purposes, to $\lambda_0 = 1550$ nm, $SiO_2$ ($\epsilon_{r,4} = 1.444^2$) was selected as the material for the cover insulating layer 140, Cu ($\epsilon_{r,3} = (0.606 - j8.26)^2$) was selected as the material of the metal film 130, $HfO_2$ ($\epsilon_{r,2} = 1.88^2$) was selected as the thin insulating layer 120, silicon ($\epsilon_{r,1} = 3.4767^2$) as the semiconductor 110, and a thin perturbative silicon region 115 of permittivity $\epsilon^+_{r,1} = (3.4767 - 0.5)^2$ and thickness 1 nm was used to model the index reduction caused by carrier accumulation in this region under an applied voltage (e.g., see FIGS. 4, 5A, and 5B). The thickness t of the metal film 130 was varied from about 10 to 30 nm, and the thickness d of the thin insulating layer 120 was taken as 2, 4 and 6 nm, in order to investigate the impact of these dimensions on the characteristics of the SPP.

Figure 6A:
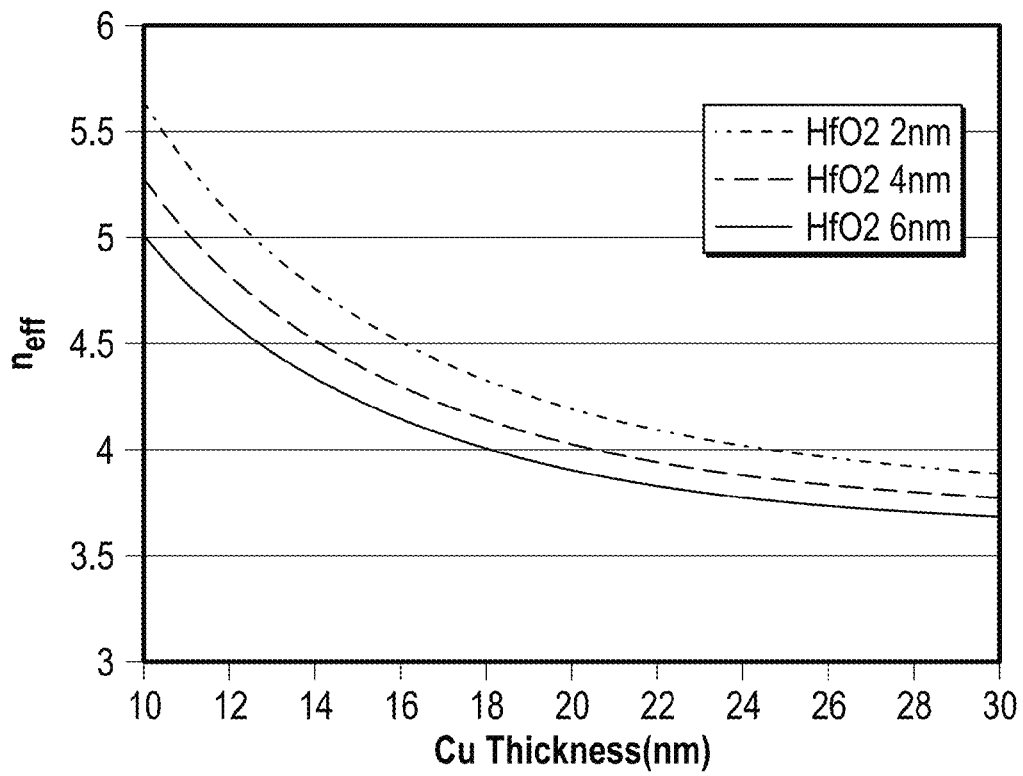
FIG. 6A includes an illustrative example of an effective refractive index $n_{eff}=\beta/\beta_0$.
Figure 6B:
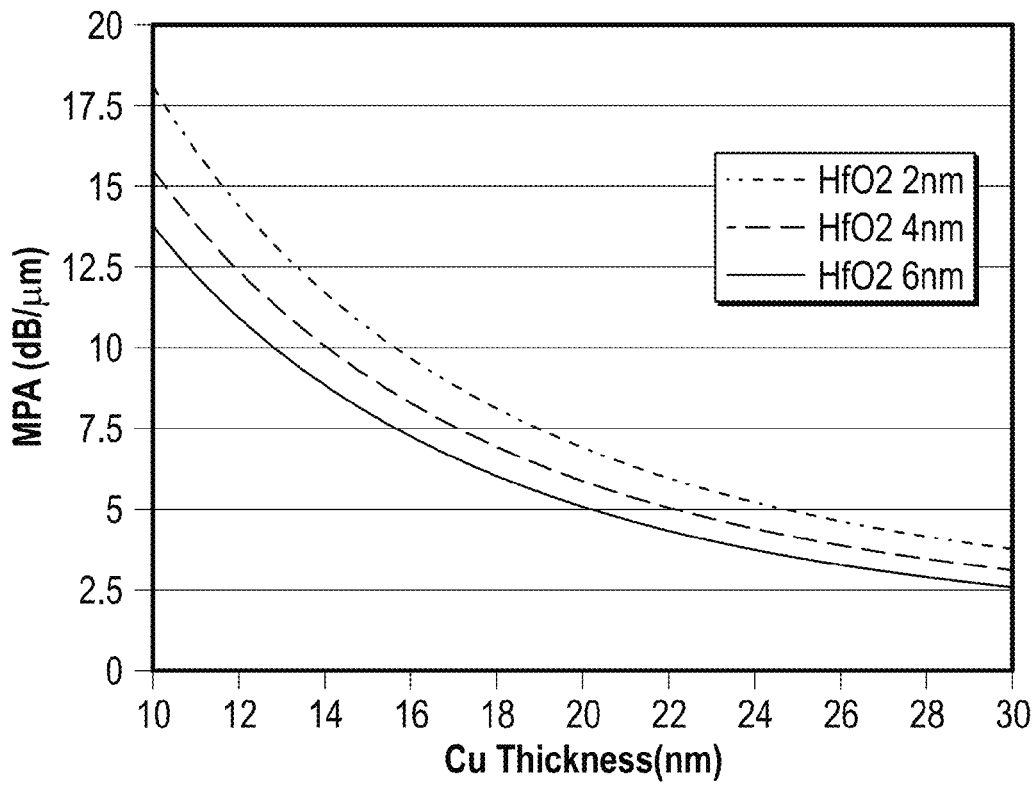
FIG. 6B includes an illustrative example of a mode power attenuation (MPA) of the surface plasmon mode localized below the metal film for a structure formed of Cu on $HfO_2$ on Si (H=0) and covered by $SiO_2$.

FIGS. 6A and 6B give the computed effective refractive index $n_{eff} = \beta/(2\pi/\lambda_0)$ and mode power attenuation (MPA), respectively, of the SPP mode localized below the metal film 130 for these dimensions, revealing that both $n_{eff}$ and MPA decrease as t and d increase, which indicates decreasing field confinement as t and d increase.

Figure 6C:
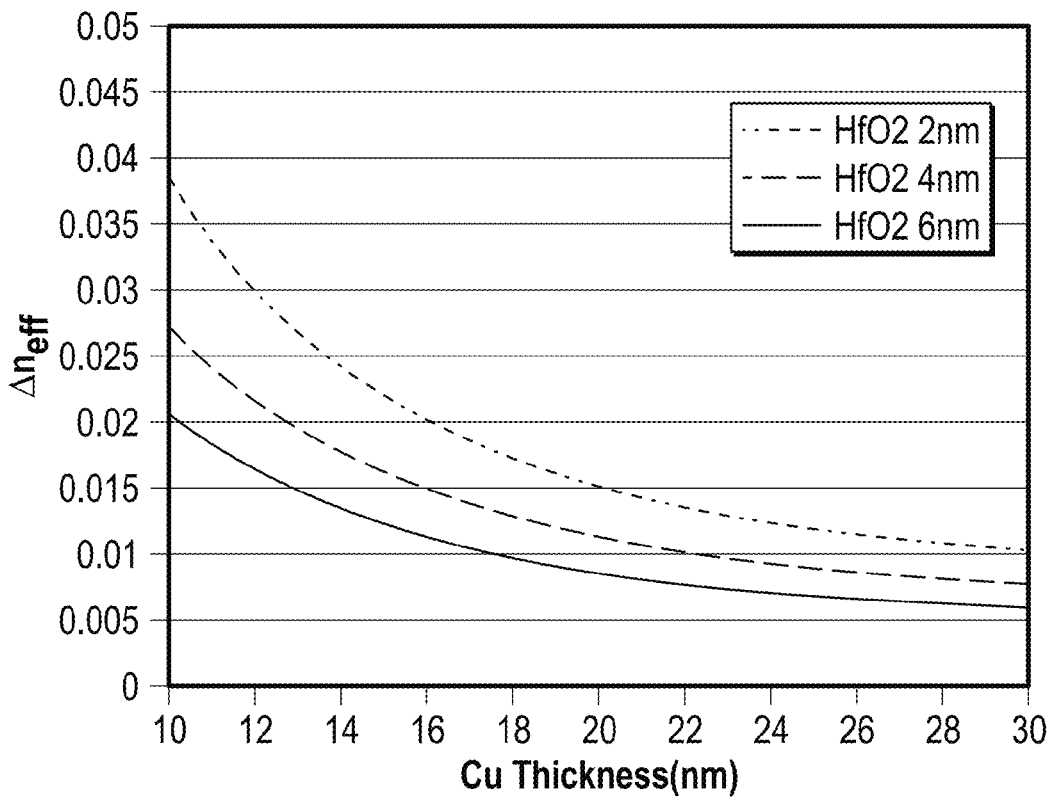
FIG. 6C includes an illustrative example showing a difference in effective refractive index due to the inclusion of a 1 nm thick refractive index perturbation of $\Delta n=-0.5$ in the Si immediately below the $HfO_2$ layer.

FIG. 6C gives the computed differential effective refractive index $\Delta n_{eff}$ of the SPP mode over the same range of dimensions (t, d) without and with the 1 nm thick perturbative region 115, revealing that $\Delta n_{eff}$ increases with decreasing t and d due to increasing SPP field confinement and overlap with region 115.

Figure 6D:
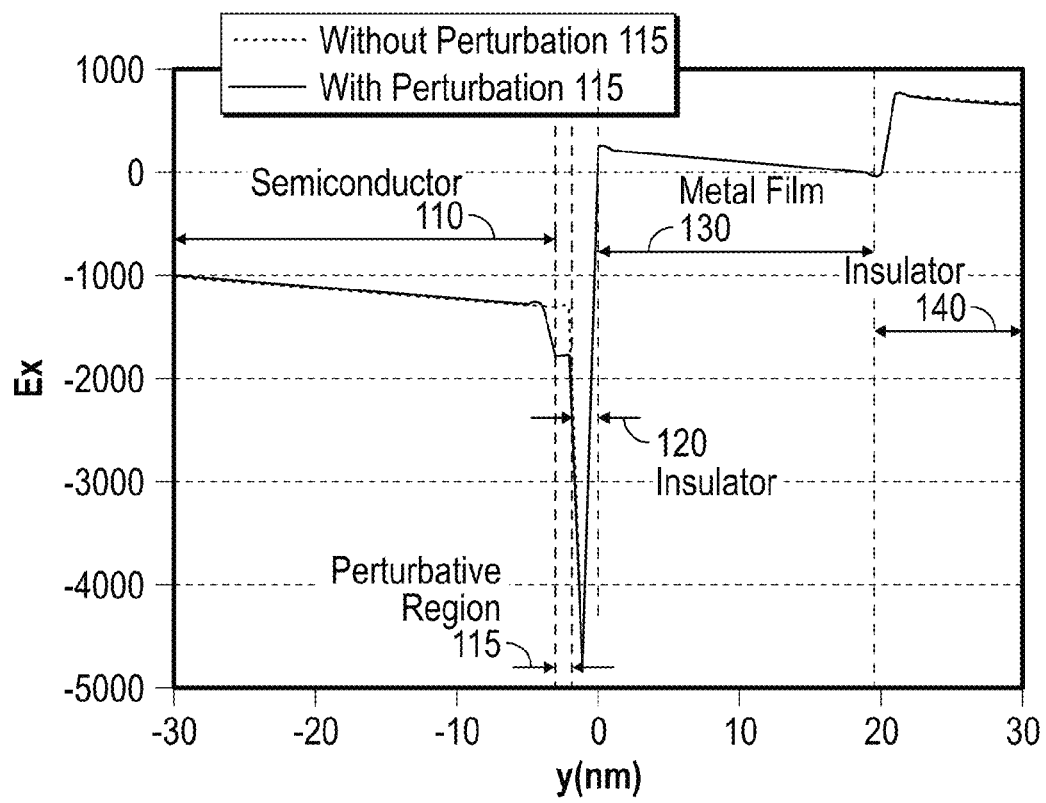
FIG. 6D includes an illustrative example showing a distribution of Re $\{E_x\}$ (electric field perpendicular to the layers) of the surface plasmon mode with and without the perturbation for the case t=20 nm and d=2 nm.

FIG. 6D gives the computed distribution of Re $\{E_x\}$, the main transverse electric field component of the SPP mode (in the direction perpendicular to the layers), over the cross-section of the structure, without and with the 1 nm thick perturbative region 115, for t=20 nm and d=2 nm, revealing that the SPP field is localized along the bottom of the metal film 130, and that the perturbation 115 has a significant impact on the field distribution in region 115. The computed $n_{eff}$ and MPA are 4.190925 and 4.175697, and 6.89 dB/µm and 6.78 dB/µm, without and with the perturbative region 115, respectively.

The example configurations discussed below illustrate generally examples of materials and dimensions that can be used to implement devices according to one or more examples discussed elsewhere herein. Such devices, as mentioned above and elsewhere, can be configured to operate as a modulator 170 or a photodetector 180. In the illustrative examples below, a 2-dimensional finite-difference time-domain (FDTD) method was used to model the optical performance of a cross-section of the device according to particular examples. A p-polarized 2-dimensional Gaussian beam, several microns in width, was assumed to originate a few microns above the device, and be perpendicularly incident onto the grating, as suggested in FIG. 2. A sufficient number of grating bumps was assumed such that the grating was wider than the incident beam. The 2-dimensional analysis is adequate to model the full device, which is invariant along the dimension out of the page. The optical parameters of the materials used are wavelength dependent and originate from the *Handbook of Optical Constants of Solids* (Palik, 1985), except for those of $HfO_2$ due to a lack of data and the small dispersion of this material over the wavelengths of interest (the relative permittivity of this material was taken as $\epsilon_r = 1.88^2$ and assumed constant over the wavelengths of interest).

Example 1

$SiO_2$ was selected as the material for the insulator 140, Cu was selected as the material for the metal film 130 and the grating bumps 150, $HfO_2$ was selected as the material for the thin insulator layer 120, n-type Si was selected as the material for the doped semiconductor 110, and a thin perturbative Si region 115 of permittivity $\epsilon'_{r,1} = (3.4767 - 0.5)^2$ and thickness 1 nm was used to model the index reduction caused by carrier accumulation in this region under an applied voltage (e.g., see FIGS. 4, 5A, and 5B).

The thickness t of the metal film 130 was varied from 14 to 26 nm, the grating bumps 150 were varied in height H from 80 to 120 nm and in width W from 80 to 120 nm, and the thickness d of the thin insulating layer 120 was taken as 2, 4 and 6 nm, in order to investigate the impact of these dimensions on the performance of the device. The free-space operating wavelength of operation was varied from $\lambda_0 = 1500$ to 1640 nm.

Figure 7A:
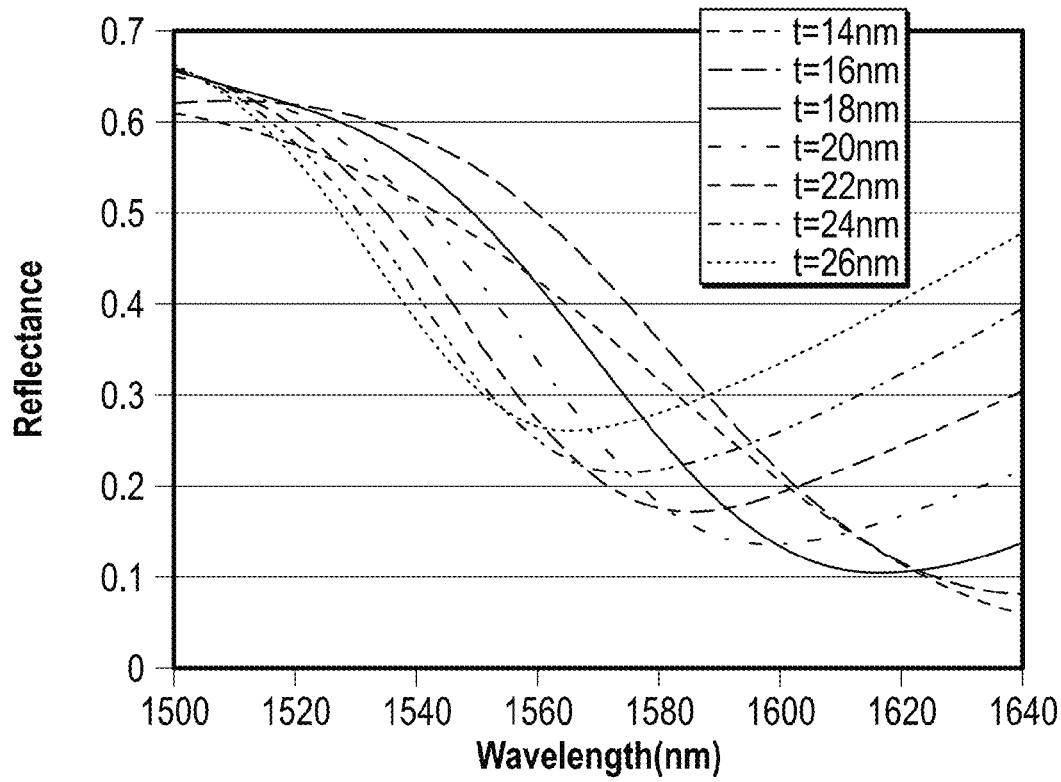
FIGS. 7A and 7B include illustrative examples of a reflectance and a coupling coefficient of Cu grating couplers as a function of wavelength and Cu film thickness (t)
Figure 7B:
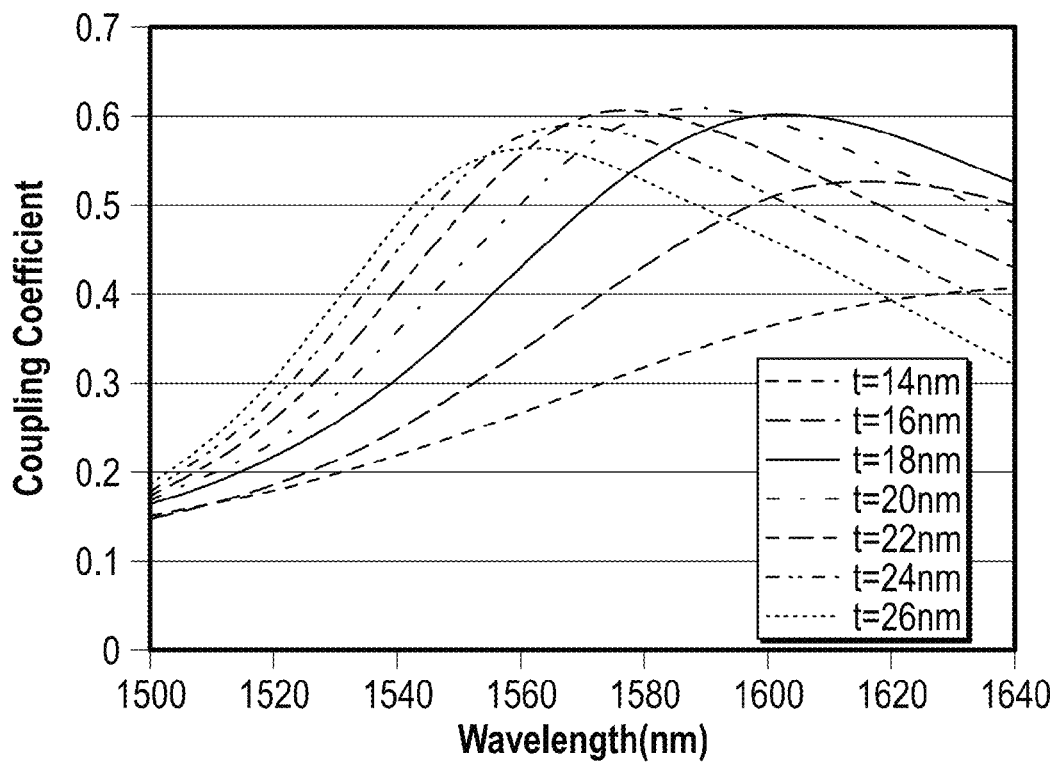

FIGS. 7A and 7B give the computed reflectance and power coupling efficiency of the incident beam to SPPs localized along the bottom surface of the metal film 130 (coupling coefficient), of the device without the thin perturbative region 115, for a grating period of P=410 nm, grating bump height of H=110 nm, grating bump width of W=205 nm, for several cases of metal film thickness t and for a thin insulating layer of d=2 nm, over the wavelength range of interest. The largest coupling coefficient is 0.6105 which occurs at $\lambda_0 = 1589$ nm for t=20 nm.

Figure 7C:
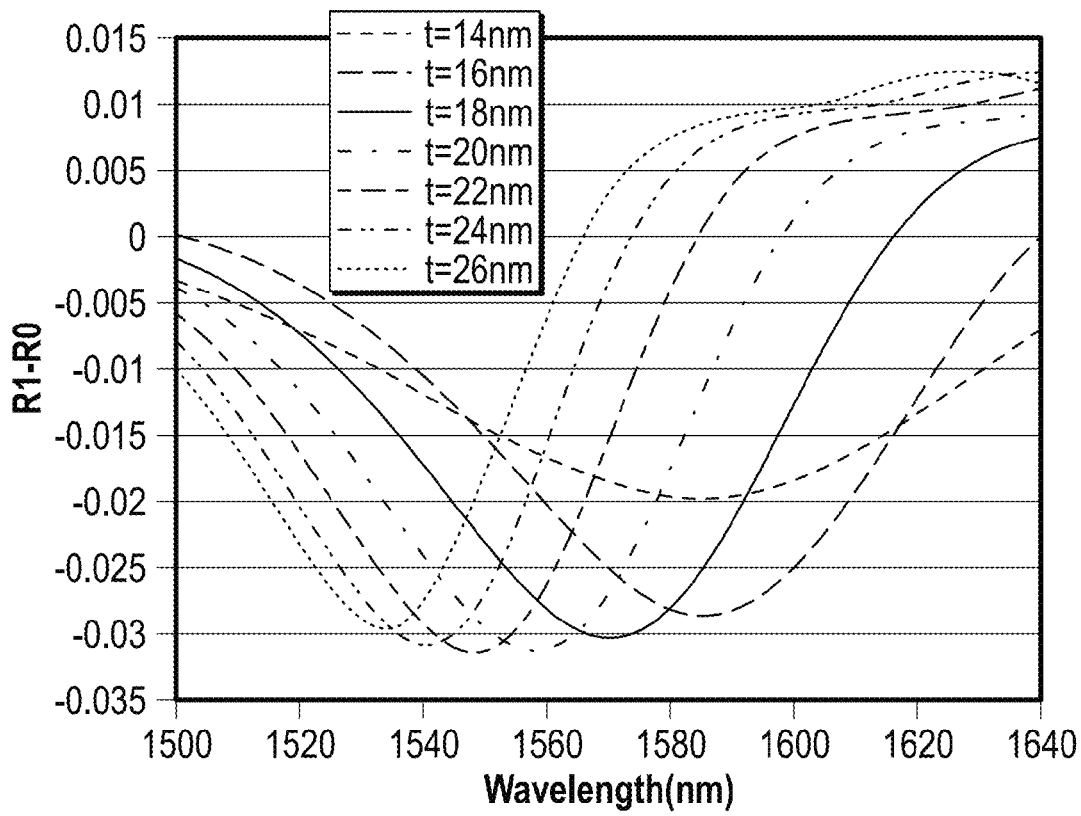
FIG. 7C includes an illustrative showing a difference in the reflectance, due to the 1 nm thick refractive index perturbation of $\Delta n=-0.5$ in the n-Si immediately below the $HfO_2$ layer, as a function of wavelength and Cu film thickness (t) and in all cases shown in FIGS. 7A through 7C, the grating parameters were set to P=410 nm, W=205 nm and H=110 nm, and the $HfO_2$ thickness to d=2 nm.

FIG. 7C gives the computed differential reflectance $R_1 - R_0$ of the device without ($R_1$) and with ($R_0$) the thin perturbative layer 115, for a grating period of P=410 nm, grating bump height of H=110 nm, grating bump width of W=205 nm, for several cases of metal film thickness t and for a thin insulating layer of d=2 nm, over the wavelength range of interest. The largest differential reflectance is 0.03124 which occurs at $\lambda_0 = 1558$ nm for t=20 nm.

Figure 8A:
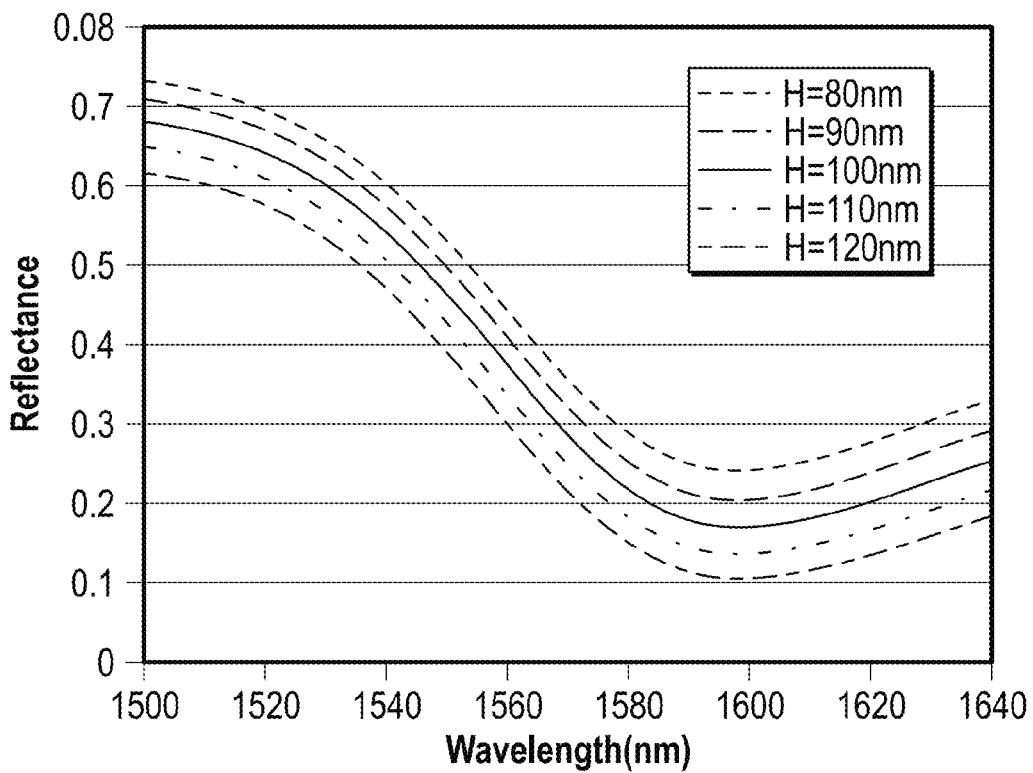
FIGS. 8A and 8B include illustrative examples showing a reflectance and a coupling coefficient of Cu grating couplers as a function of wavelength and grating bump height (H)
Figure 8B:
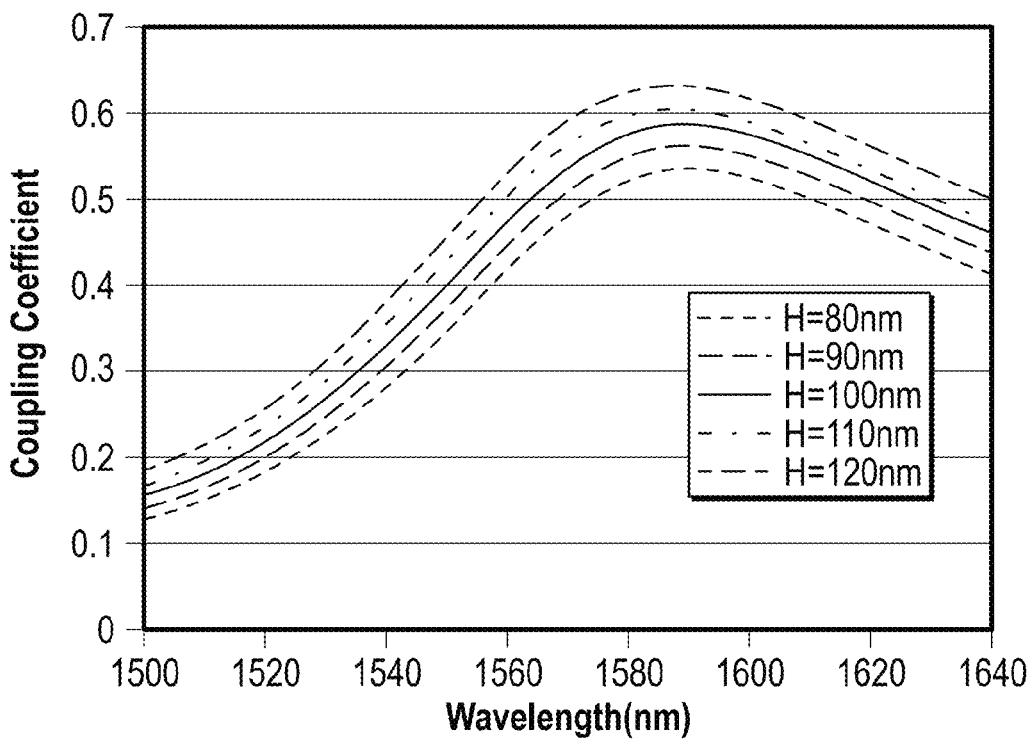

FIGS. 8A and 8B give the computed reflectance and power coupling efficiency of the incident beam to SPPs localized along the bottom surface of the metal film 130 (coupling coefficient), of the device without the thin perturbative region 115, for a metal film thickness of t=20 nm, a grating period of P=410 nm and grating bump width of W=205 nm, for several cases of grating bump heights H, for a thin insulating layer of d=2 nm, over the wavelength range of interest. The coupling efficiency increases as the bump height H increases.

Figure 8C:
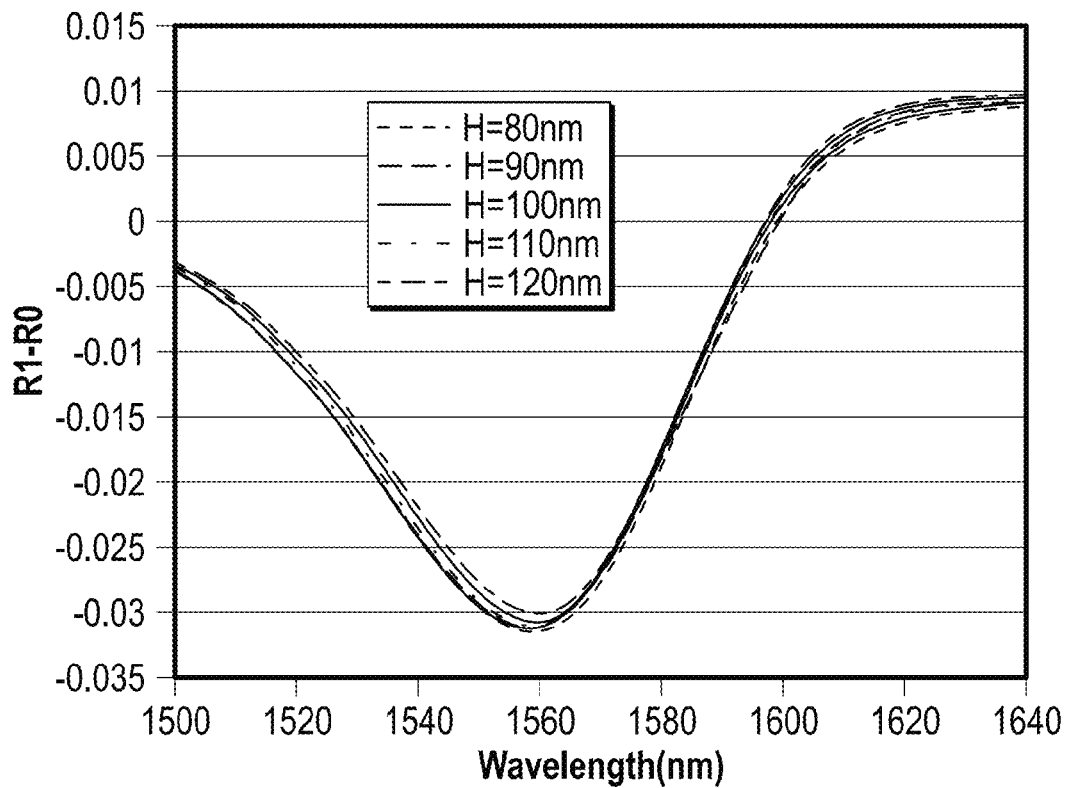
FIG. 8C shows the difference in the reflectance, due to the 1 nm thick refractive index perturbation of $\Delta n=-0.5$ in the n-Si immediately below the $HfO_2$ layer, as a function of wavelength and grating bump height (H) and in all cases shown in FIGS. 8A through 8C, the grating parameters were set to P=410 nm and W=205 nm, the Cu film thickness to t=20 nm, and the $HfO_2$ thickness to d=2 nm.

FIG. 8C gives the computed differential reflectance $R_1 - R_0$ of the device without ($R_1$) and with ($R_0$) the thin perturbative layer 115, for a metal film thickness of t=20 nm, a grating period of P=410 nm and grating bump width of W=205 nm, for several cases of grating bump heights H, for a thin insulating layer of d=2 nm, over the wavelength range of interest. The largest differential reflectance is 0.03124 which occurs at $\lambda_0 = 1558$ nm for H=110 nm.

Figure 9A:
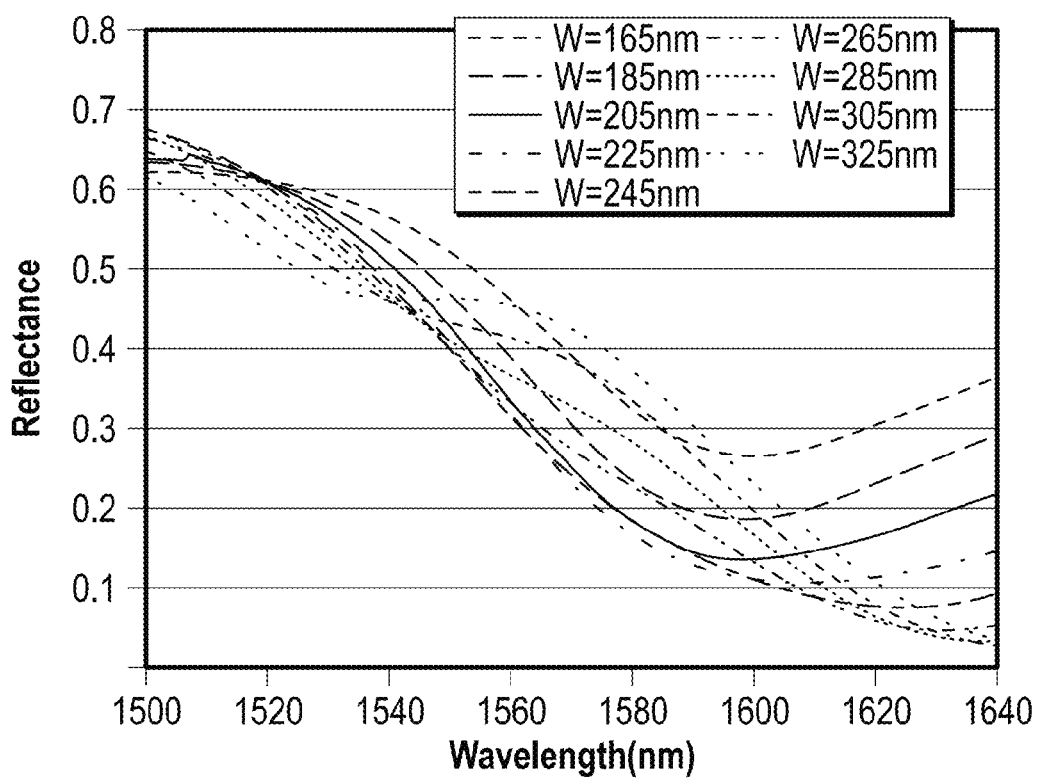
FIGS. 9A and 9B include illustrative examples showing a reflectance and a coupling coefficient of Cu grating couplers as a function of wavelength and grating bump width (W)
Figure 9B:
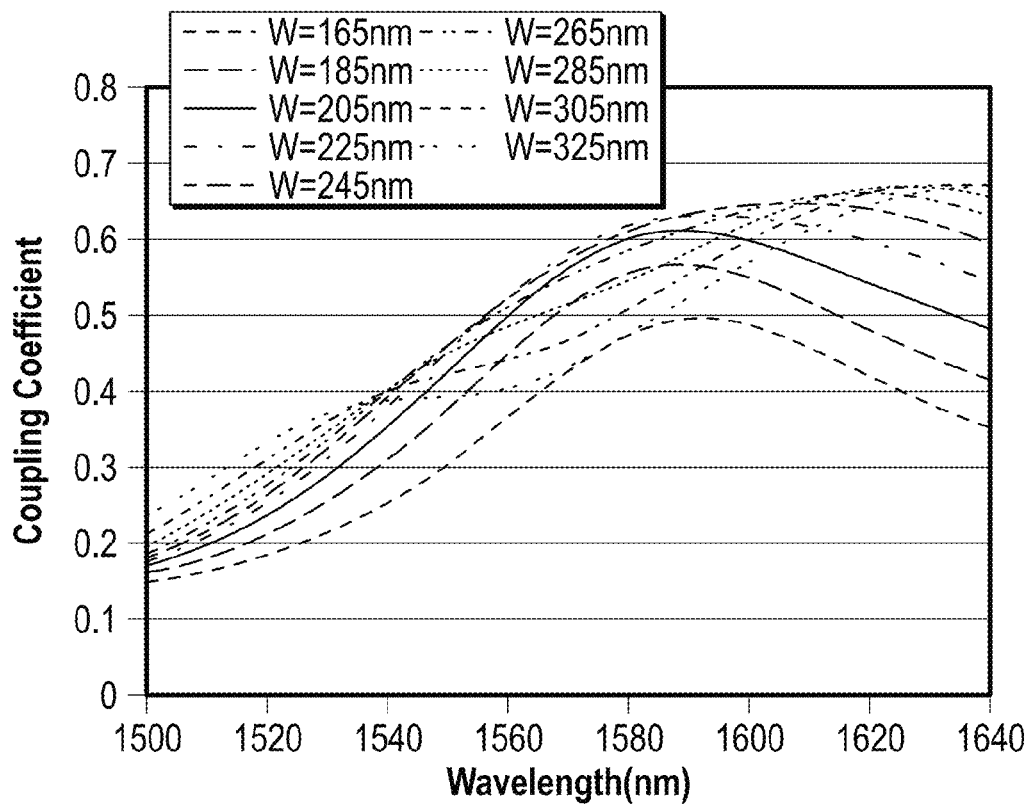

FIGS. 9A and 9B give the computed reflectance and power coupling efficiency of the incident beam to SPPs localized along the bottom surface of the metal film 130 (coupling coefficient), of the device without the thin perturbative region 115, for a metal film thickness of t=20 nm, a grating period of P=410 nm and grating bump height of H=110 nm, for several cases of grating bump widths W, for a thin insulating layer of d=2 nm, over the wavelength range of interest. The coupling efficiency increases as the bump height H increases. The largest coupling coefficient is 0.67234 which occurs at $\lambda_0$=1633 nm for W=235 nm.

Figure 9C:
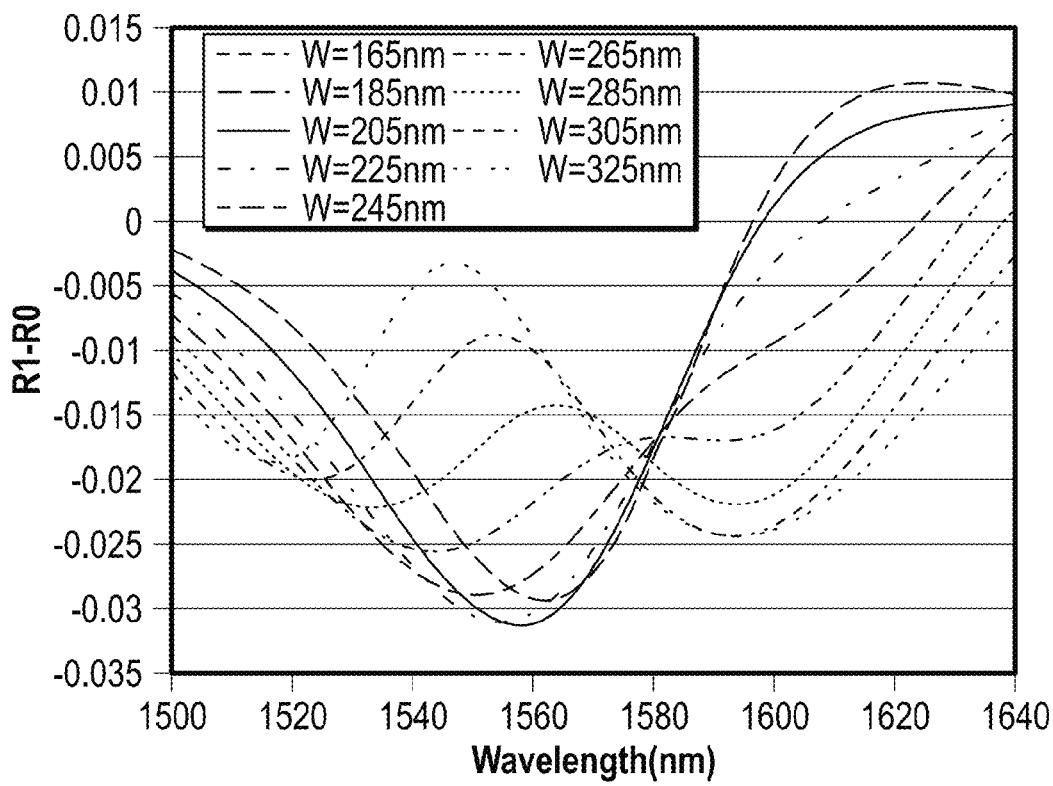
FIG. 9C shows the difference in the reflectance, due to the 1 nm thick refractive index perturbation of $\Delta n=-0.5$ in the n-Si immediately below the $HfO_2$ layer, as a function of wavelength and grating bump width (W) and in all cases shown in FIGS. 9A through 9C, the grating parameters were set to P=410 nm and H=110 nm, the Cu film thickness to t=20 nm, and the $HfO_2$ thickness to d=2 nm.

FIG. 9C gives the computed differential reflectance $R_1-R_0$ of the device without ($R_1$) and with ($R_0$) the thin perturbative layer 115, for a metal film thickness of t=20 nm, a grating period of P=410 nm and grating bump height of H=110 nm, for several cases of grating bump widths W, for a thin insulating layer of d=2 nm, over the wavelength range of interest. The largest differential reflectance is 0.03124 which occurs at $\lambda_0$=1558 nm for W=205 nm (50% duty cycle).

Figure 10A:
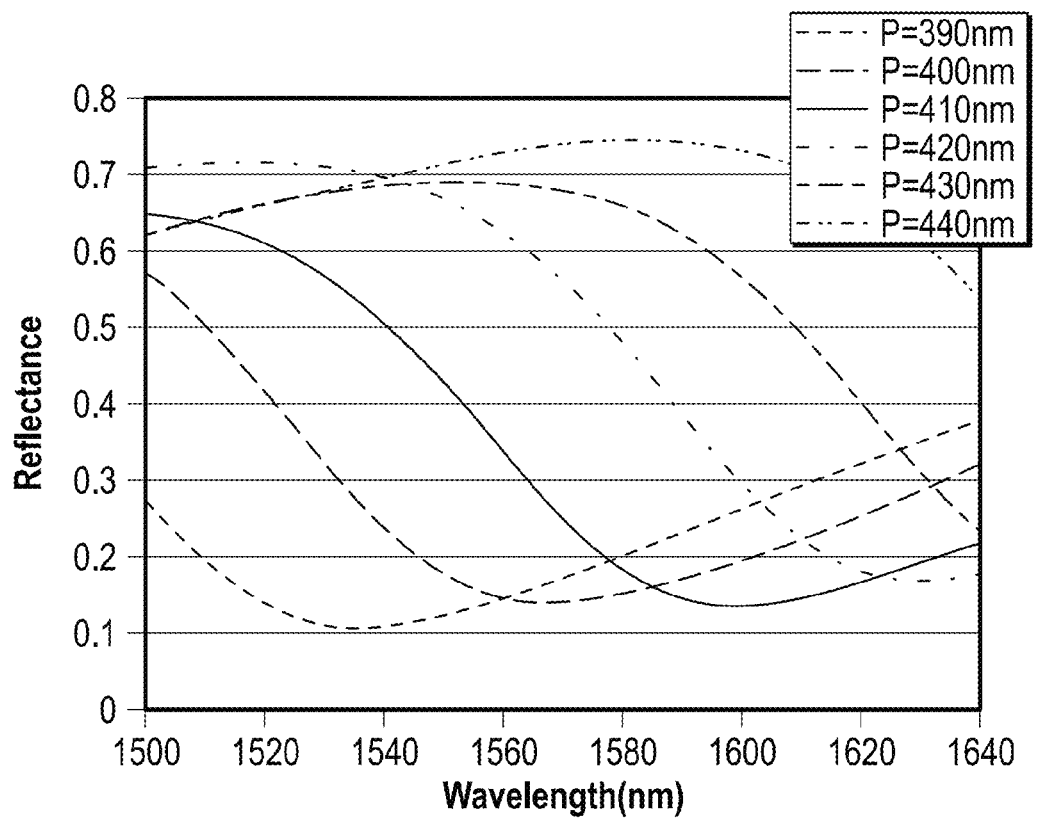
FIG. 10A includes an illustrative example showing a reflectance of Cu grating couplers as a function of wavelength and grating period (P)

FIG. 10A gives the computed reflectance of the device without the thin perturbative region 115 for dimensions leading to a good differential reflectance ($R_1-R_0$), such as metal film thickness of t=20 nm, grating bump height of H=110 nm and grating bump width of W=P/2 (50% duty cycle), for several cases of grating period P over the range from P=390 to 440 nm, for a thin insulating layer of d=2 nm, over the wavelength range of interest.

Figure 10B:
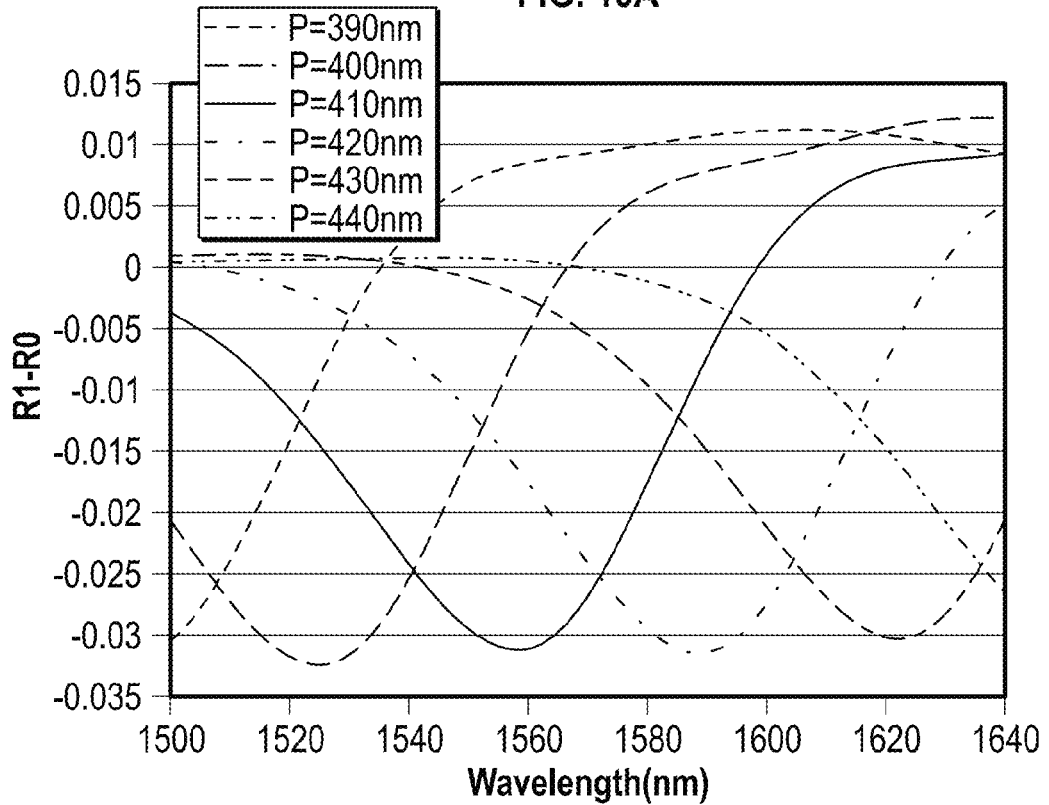
FIGS. 10B, 10C, and 10D include illustrative examples showing a difference in the reflectance, due to the 1 nm thick refractive index perturbation of $\Delta n=-0.5$ in the n-Si immediately below the $HfO_2$ layer, as a function of wavelength and grating period (P) and in all cases shown in FIGS. 10A through 10D the grating parameters were set to W=P/2 and H=110 nm, the Cu film thickness to t=20 nm, and the HfO$_2$ thickness to d=2 nm in FIGS. 10A and 10B, d=4 nm in FIG. 10C, and d=6 nm in FIG. 10D.

FIG. 10B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=20 nm, grating bump height of H=110 nm and grating bump width of W=P/2 (50% duty cycle), for several cases of grating period P over the range from P=390 to 440 nm, for a thin insulating layer of d=2 nm, over the wavelength range of interest.

Figure 10C:
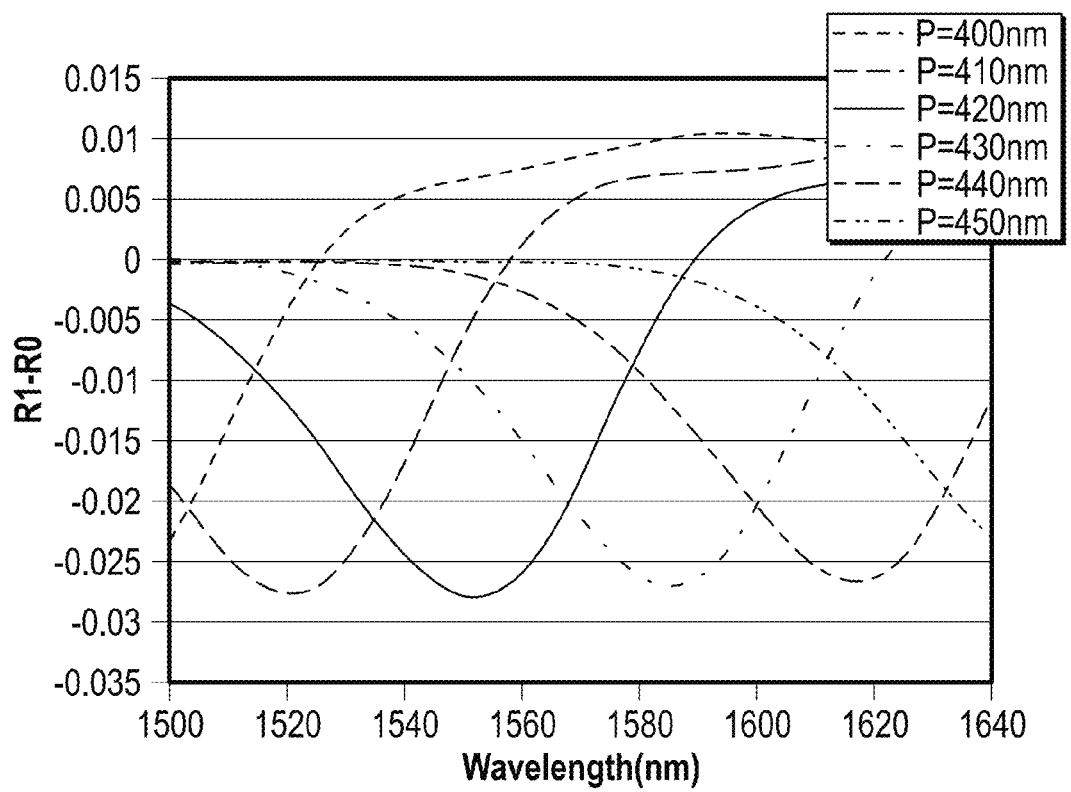

FIG. 10C gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=20 nm, grating bump height of H=110 nm and grating bump width of W=P/2 (50% duty cycle), for several cases of grating period P over the range from P=390 to 440 nm, for a thin insulating layer of d=4 nm, over the wavelength range of interest.

Figure 10D:
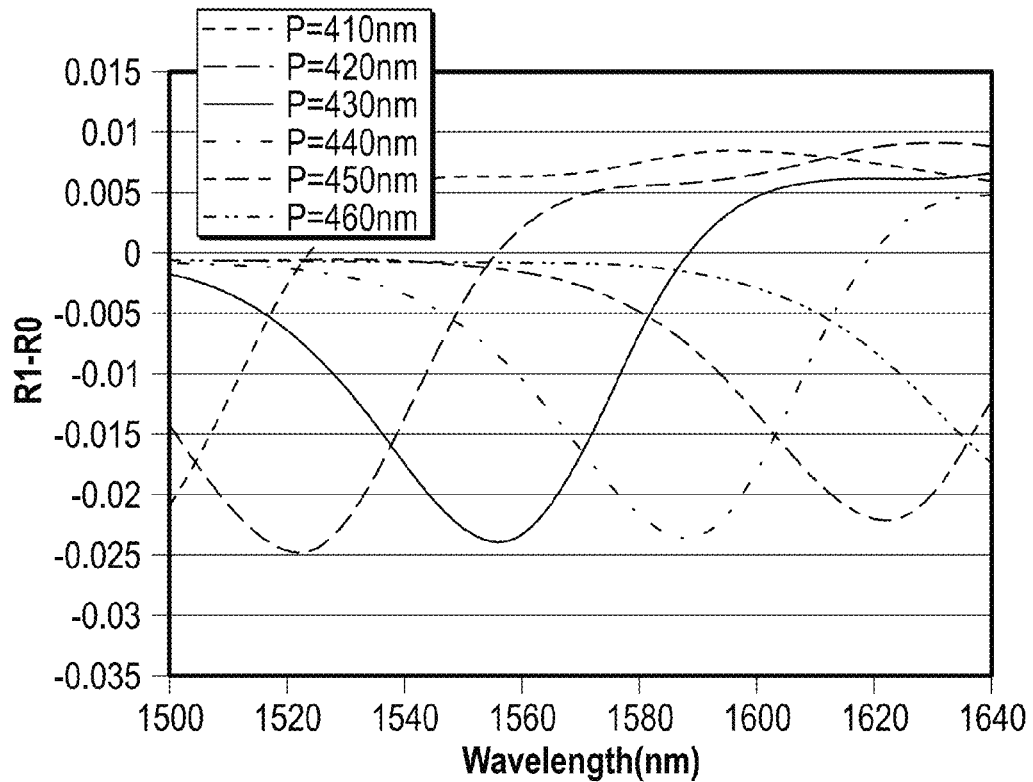

FIG. 10D gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=20 nm, grating bump height of H=110 nm and grating bump width of W=P/2 (50% duty cycle), for several cases of grating period P over the range from P=390 to 440 nm, for a thin insulating layer of d=6 nm, over the wavelength range of interest.

A peak differential reflectance occurs at longer wavelengths, and decreases in magnitude, as d increases, as shown by comparing FIGS. 10B, 10C and 10D. In an illustration of a device configured to operate as a modulator 170, a configuration can be selected to produce a large differential reflectance ($R_1-R_0$) (such configurations also generally produce a large differential transmittance). In an illustration of a device configured to operate as a photodetector 180, a configuration can be selected to produce a large coupling coefficient for the incident beam to SPPs localized along the bottom surface of the metal film 130.

Example 2

SiO$_2$ was selected as the material for the insulator 140, Cu was selected as the material for the metal film 130 and the grating bumps 150, SiO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 18 to 22 nm, the grating bumps 150 were varied in height H from 90 to 120 nm, the grating bump width was set to W=P/2 (50% duty cycle), and the thickness d of the thin insulating layer 120 was taken as 2 nm, in order to illustrate the impact of these dimensions on the performance of the device. The free-space operating wavelength of operation was varied from $\lambda_0$=1500 to 1640 nm.

Figure 11A:
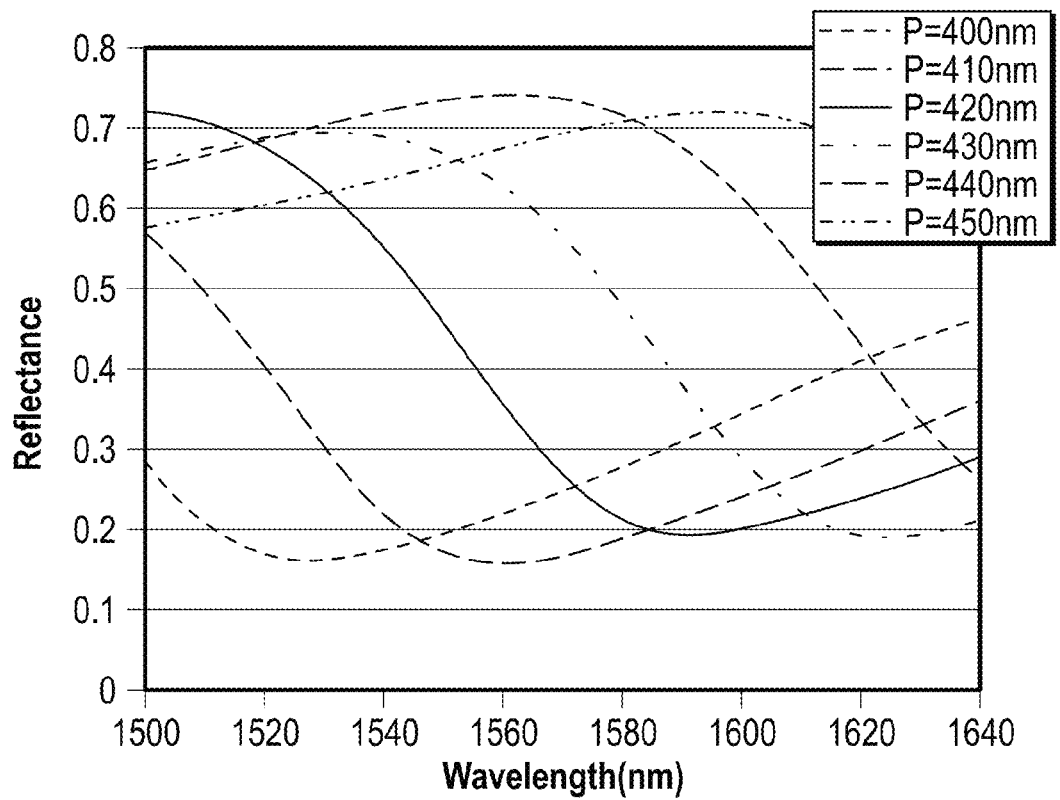
FIG. 11A includes an illustrative example showing a reflectance of Cu grating couplers as a function of wavelength and grating period (P)

FIG. 11A gives the computed reflectance of the device without the thin perturbative region 115 for dimensions leading to a good differential reflectance ($R_1-R_0$), such as metal film thickness of t=20 nm, grating bump height of H=100 nm, for several cases of grating period P over the range from P=400 to 420 nm, over the wavelength range of interest.

Figure 11B:
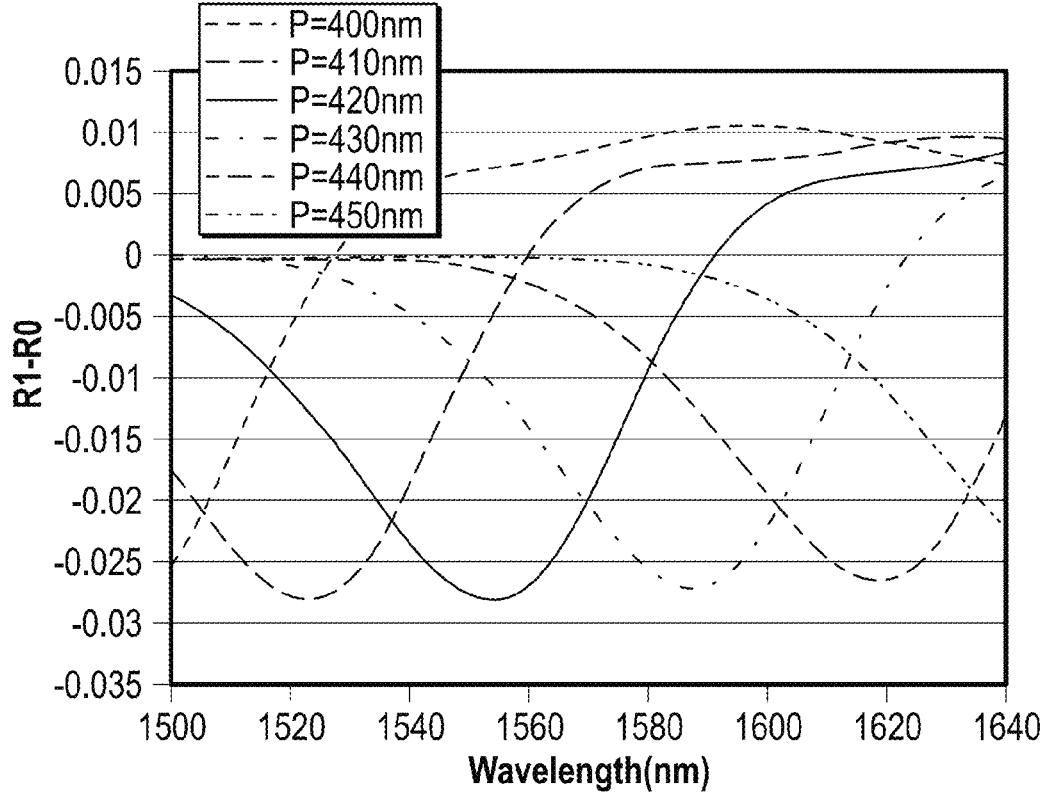
FIG. 11B includes an illustrative example showing the difference in the reflectance, due to the 1 nm thick refractive index perturbation of Δn=−0.5 in the n-Si immediately below the SiO$_2$ layer, as a function of wavelength and grating period (P) and in the cases shown in FIGS. 11A and 11B, the grating parameters were set to W=P/2 and H=100 nm, the Cu film thickness to t=20 nm, and the SiO$_2$ thickness to d=2 nm.

FIG. 11B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=20 nm, grating bump height of H=100 nm, for several cases of grating period P over the range from P=400 to 450 nm, over the wavelength range of interest. Differential reflectances ($R_1-R_0$) of about 0.025 to 0.027 are achievable for several configurations following this example.

Example 3

SiO$_2$ was selected as the material for the insulator 140, Au was selected as the material for the metal film 130 and the grating bumps 150, HfO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 16 to 24 nm, the grating bumps 150 were varied in height H from 110 to 160 nm, the grating bump width was set to W=P/2 (50% duty cycle), and the thickness d of the thin insulating layer 120 was taken as 2 nm, in order to illustrate the impact of these dimensions on the performance of the device. The free-space operating wavelength of operation was varied from $\lambda_0$=1500 to 1640 nm.

Figure 12A:
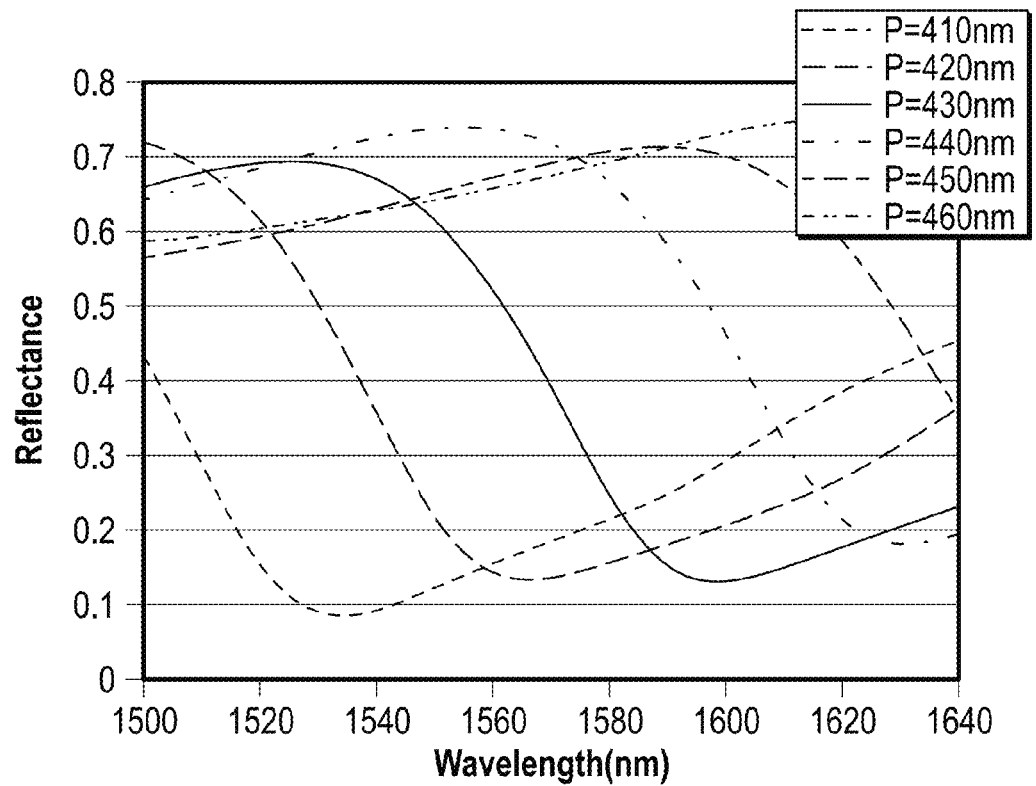
FIG. 12A includes an illustrative example showing a reflectance of Au grating couplers as a function of wavelength and grating period (P)

FIG. 12A gives the computed reflectance of the device without the thin perturbative region 115 for dimensions leading to a good differential reflectance ($R_1-R_0$), such as metal film thickness of t=18 nm, grating bump height of H=140 nm, for several cases of grating period P over the range from P=410 to 460 nm, over the wavelength range of interest.

Figure 12B:
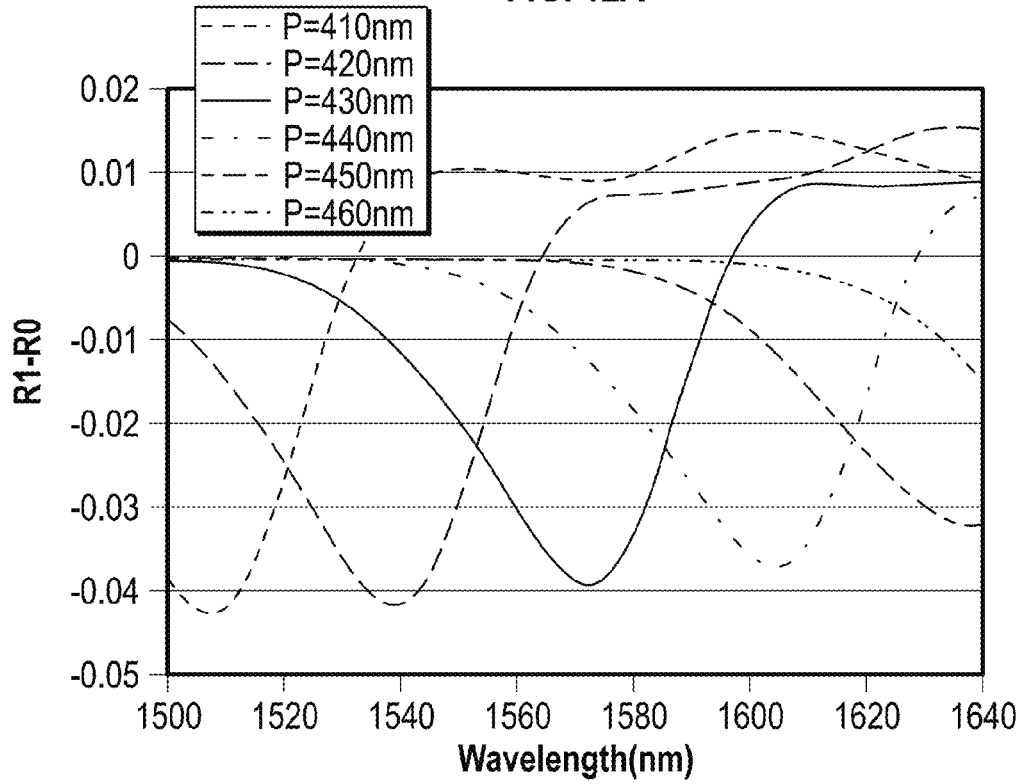
FIG. 12B includes an illustrative example showing a difference in the reflectance, due to the 1 nm thick refractive index perturbation of Δn=−0.5 in the n-Si immediately below the HfO$_2$ layer, as a function of wavelength and grating period (P) and in the cases shown in FIGS. 12A and 12B, the grating parameters were set to W=P/2 and H=140 nm, the Au film thickness to t=18 nm, and the HfO$_2$ thickness to d=2 nm.

FIG. 12B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=18 nm, grating bump height of H=140 nm, for several cases of grating period P over the range from P=410 to 460 nm, over the wavelength range of interest. Differential reflectances ($R_1-R_0$) of about 0.03 to 0.042 are achievable for several configurations following this example.

Example 4

SiO$_2$ was selected as the material for the insulator 140, Au was selected as the material for the metal film 130 and the grating bumps 150, SiO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 16 to 20 nm, the grating bumps 150 were varied in height H from 120 to 150 nm, the grating bump width was set to W=P/2 (50% duty cycle), and the thickness d of the thin insulating layer 120 was taken as 2 nm, in order to investigate the impact of these dimensions on the performance of the device. The free-space operating wavelength of operation was varied from $\lambda_0$=1500 to 1640 nm.

Figure 13A:
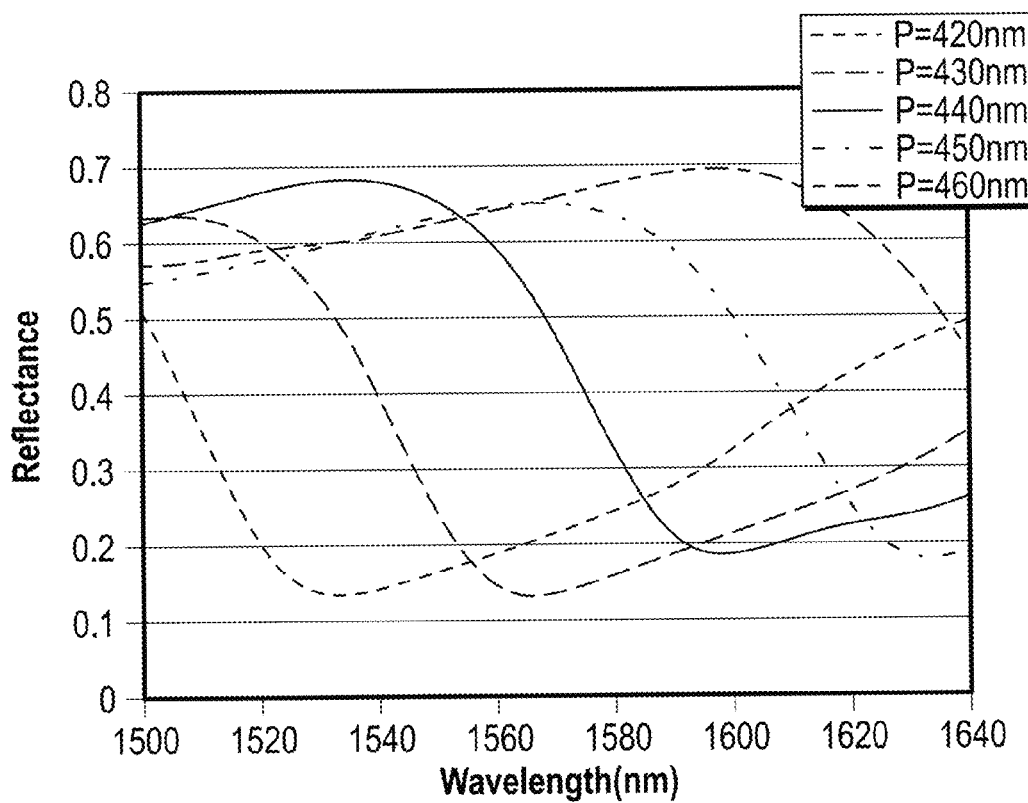
FIG. 13A includes an illustrative example showing a reflectance of Au grating couplers as a function of wavelength and grating period (P)

FIG. 13A gives the computed reflectance of the device without the thin perturbative region 115 for dimensions leading to a good differential reflectance ($R_1-R_0$), such as metal film thickness of t=18 nm, grating bump height of H=140 nm, for several cases of grating period P over the range from P=420 to 460 nm, over the wavelength range of interest.

Figure 13B:
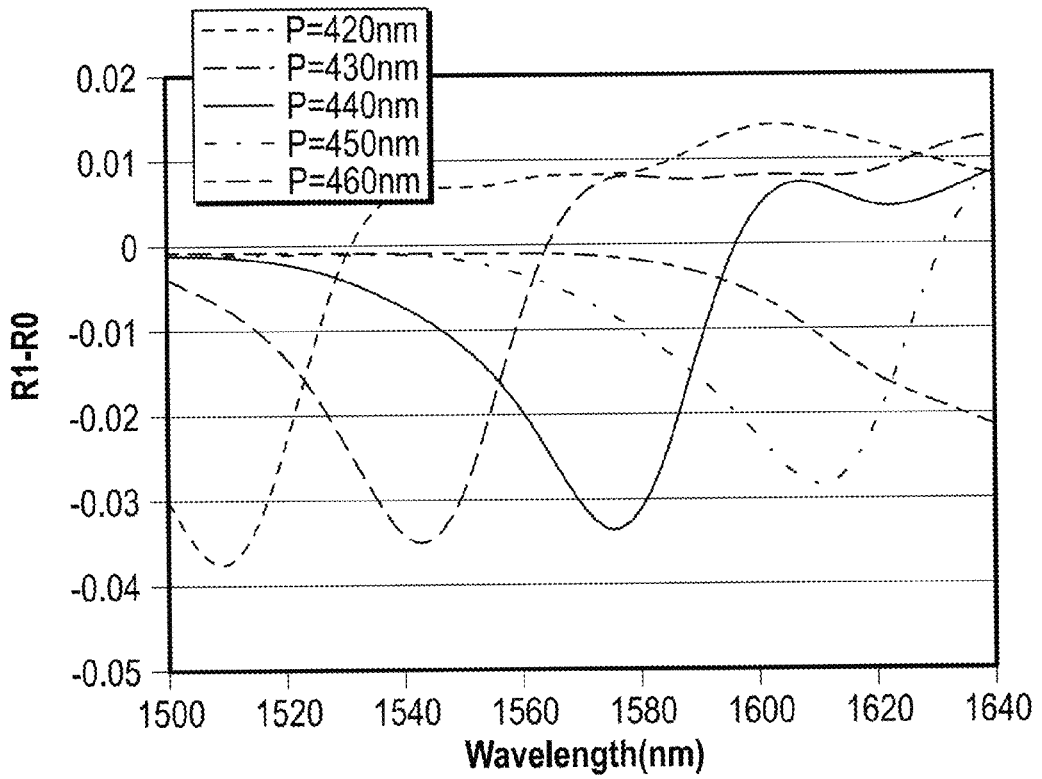
FIG. 13B includes an illustrative example showing a difference in the reflectance, due to the 1 nm thick refractive index perturbation of Δn=−0.5 in the n-Si immediately below the SiO$_2$ layer, as a function of wavelength and grating period (P) and in the cases shown in FIGS. 13A and 13B, the grating parameters were set to W=P/2 and H=140 nm, the Au film thickness to t=18 nm, and the SiO$_2$ thickness to d=2 nm.

FIG. 13B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=18 nm, grating bump height of H=140 nm, for several cases of grating period P over the range from P=420 to 460 nm, over the wavelength range of interest. Differential reflectances ($R_1-R_0$) of about 0.02 to 0.037 are achievable for several configurations following this example.

Example 5

SiO$_2$ was selected as the material for the insulator 140, Cu was selected as the material for the metal film 130 and the grating bumps 150, HfO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 22 to 28 nm, the grating bumps 150 were varied in height H from 80 to 120 nm, the grating bump width was set to W=P/2 (50% duty cycle), and the thickness d of the thin insulating layer 120 was taken as 2 nm, in order to illustrate the impact of these dimensions on the performance of the device. The free-space operating wavelength of operation was varied from $\lambda_0$=1240 to 1370 nm.

Figure 14A:
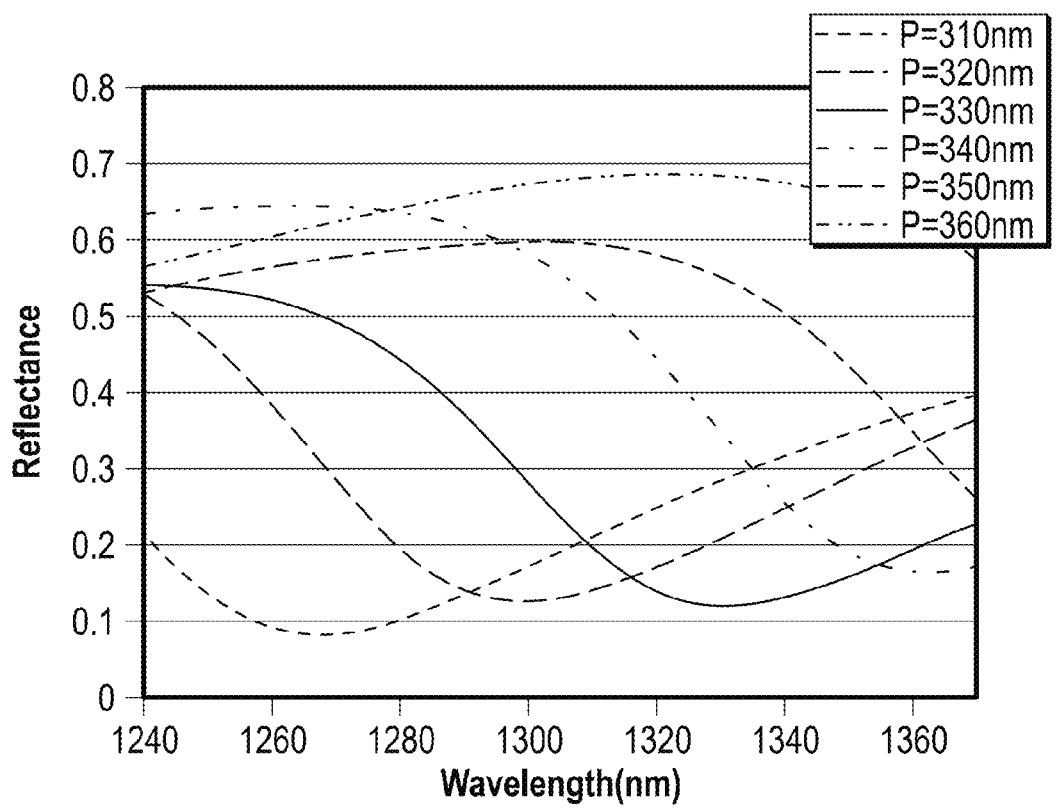
FIG. 14A includes an illustrative example showing a reflectance of Cu grating couplers as a function of wavelength and grating period (P)

FIG. 14A gives the computed reflectance of the device without the thin perturbative region 115 for dimensions leading to a good differential reflectance ($R_1-R_0$), such as metal film thickness of t=24 nm, grating bump height of H=100 nm, for several cases of grating period P over the range from P=310 to 360 nm, over the wavelength range of interest.

Figure 14B:
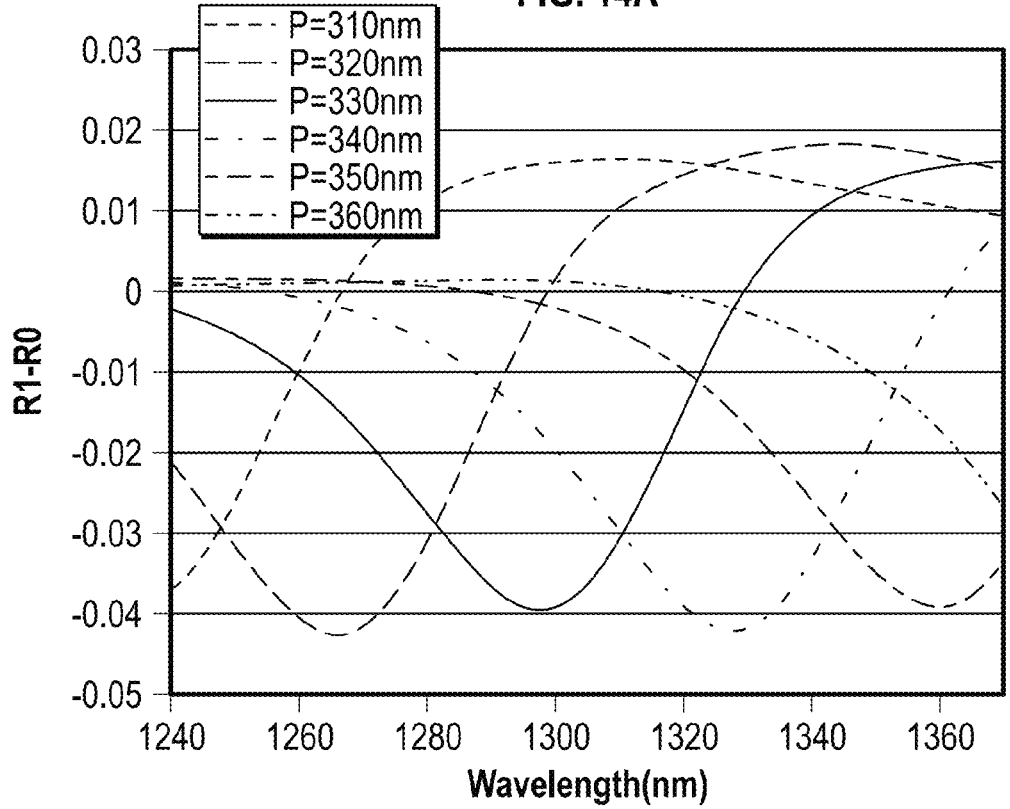
FIG. 14B includes an illustrative example showing a difference in the reflectance, due to the 1 nm thick refractive index perturbation of Δn=−0.5 in the n-Si immediately below the HfO$_2$ layer, as a function of wavelength and grating period (P) and in the cases shown in FIGS. 14A and 14B, the grating parameters were set to W=P/2 and H=100 nm, the Cu film thickness to t=24 nm, and the HfO$_2$ thickness to d=2 nm.

FIG. 14B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=24 nm, grating bump height of H=100 nm, for several cases of grating period P over the range from P=310 to 360 nm, over the wavelength range of interest. Differential reflectances ($R_1-R_0$) of about 0.04 are achievable for several configurations following this example.

Example 6

SiO$_2$ was selected as the material for the insulator 140, Cu was selected as the material for the metal film 130 and the grating bumps 150, SiO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 18 to 24 nm, the grating bumps 150 were varied in height H from 70 to 110 nm, the grating bump width was set to W=P/2 (50% duty cycle), and the thickness d of the thin insulating layer 120 was taken as 2 nm, in order to illustrate the impact of these dimensions on the performance of the device. The free-space operating wavelength of operation was varied from $\lambda_0$=1240 to 1370 nm.

Figure 15A:
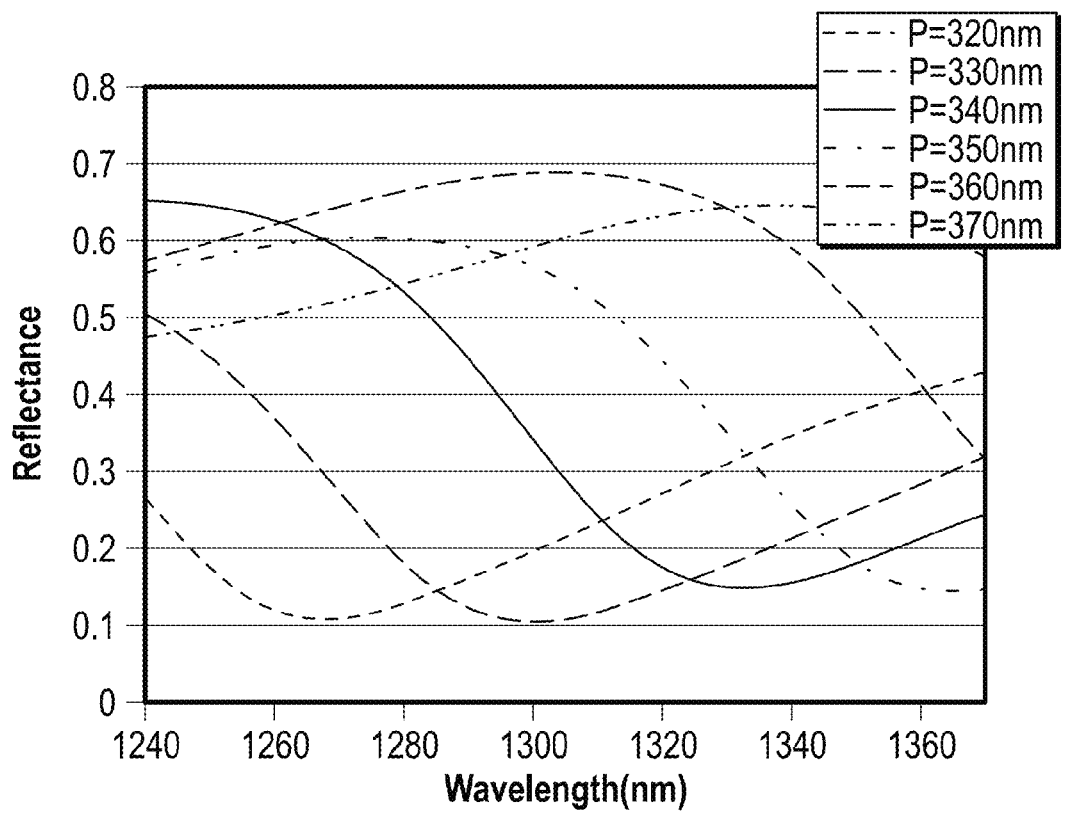
FIG. 15A includes an illustrative example showing a reflectance of Cu grating couplers as a function of wavelength and grating period (P)

FIG. 15A gives the computed reflectance of the device without the thin perturbative region 115 for dimensions leading to a good differential reflectance ($R_1-R_0$), such as metal film thickness of t=22 nm, grating bump height of H=90 nm, for several cases of grating period P over the range from P=320 to 370 nm, over the wavelength range of interest.

Figure 15B:
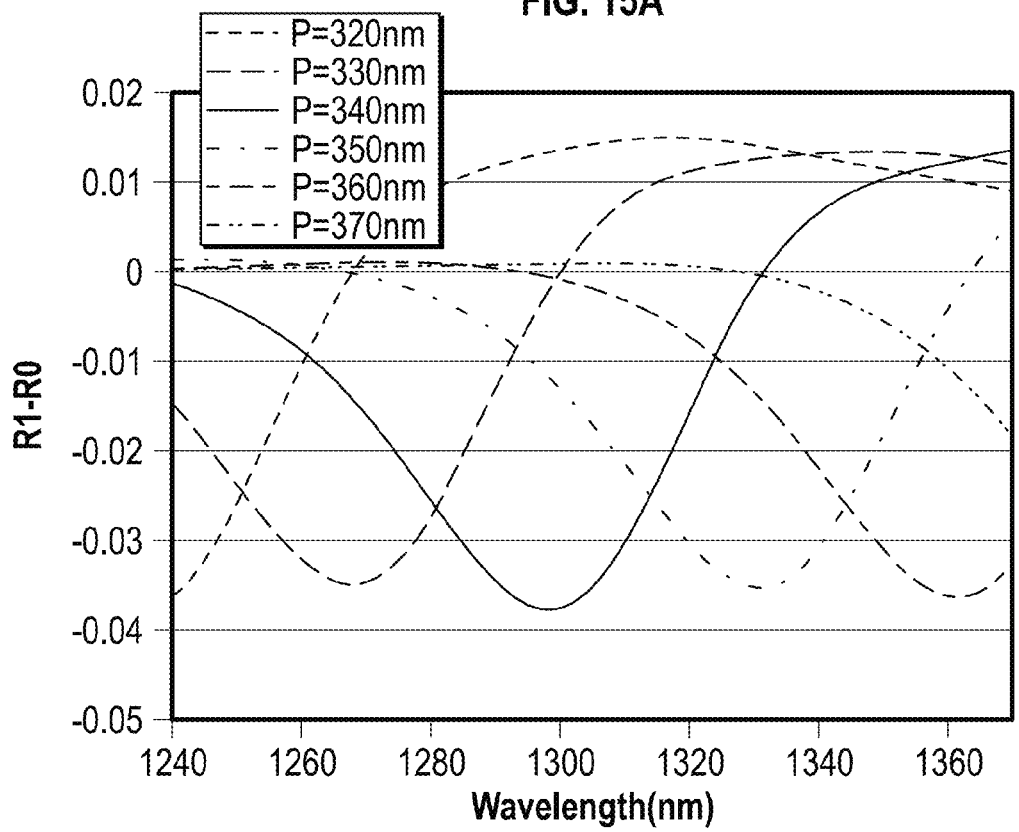
FIG. 15B includes an illustrative example showing a difference in the reflectance, due to the 1 nm thick refractive index perturbation of Δn=−0.5 in the n-Si immediately below the SiO$_2$ layer, as a function of wavelength and grating period (P) and in the cases shown in FIGS. 15A and 15B, the grating parameters were set to W=P/2 and H=90 nm, the Cu film thickness to t=22 nm, and the SiO$_2$ thickness to d=2 nm.

FIG. 15B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=22 nm, grating bump height of H=90 nm, for several cases of grating period P over the range from P=320 to 370 nm, over the wavelength range of interest. Differential reflectances ($R_1-R_0$) of about 0.035 are achievable for several configurations following this example.

Example 7

SiO$_2$ was selected as the material for the insulator 140, Au was selected as the material for the metal film 130 and the grating bumps 150, HfO$_2$ was selected as the material for the thin insulator layer 120, n-type Si was selected as the material for the doped semiconductor 110, and a thin perturbative Si region 115 of permittivity $\in'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 16 to 22 nm, the grating bumps 150 were varied in height H from 70 to 110 nm, the grating bump width was set to W=P/2 (50% duty cycle), and the thickness d of the thin insulating layer 120 was taken as 2 nm, in order to investigate the impact of these dimensions on the performance of the device. The free-space operating wavelength of operation was varied from $\lambda_0$=1240 to 1370 nm.

Figure 16A:
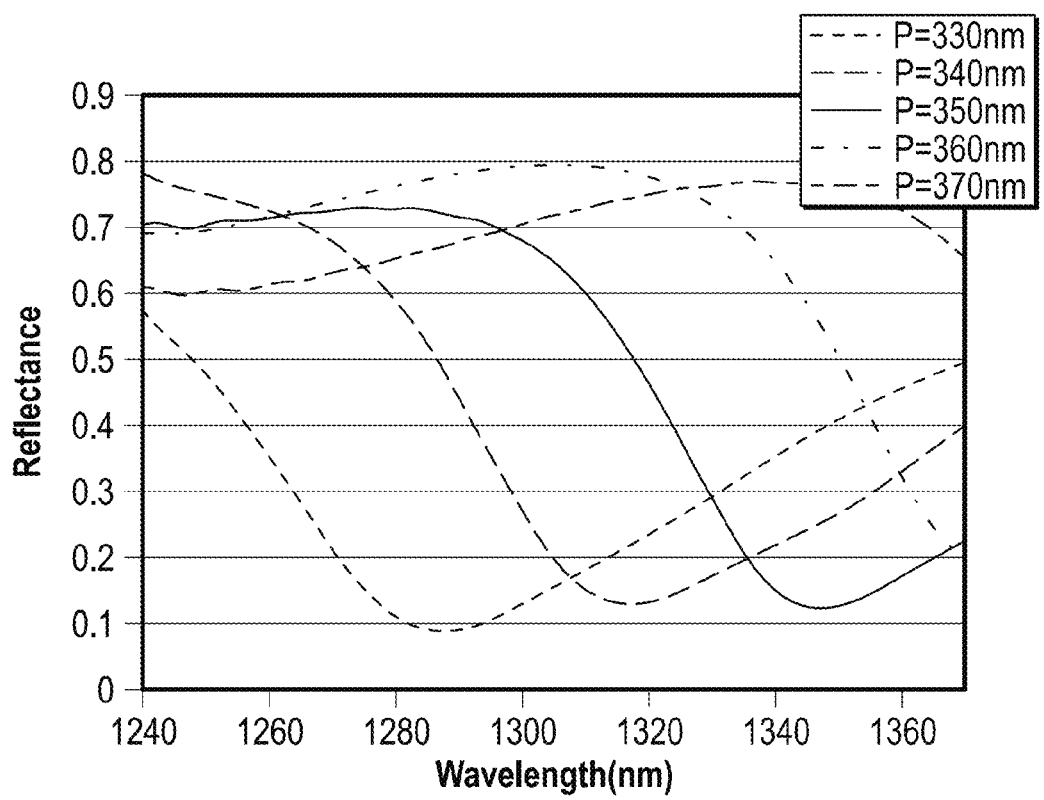
FIG. 16A includes an illustrative example showing a reflectance of Au grating couplers as a function of wavelength and grating period (P)

FIG. 16A gives the computed reflectance of the device without the thin perturbative region 115 for dimensions leading to a good differential reflectance ($R_1-R_0$), such as metal film thickness of t=18 nm, grating bump height of H=90 nm, for several cases of grating period P over the range from P=330 to 370 nm, over the wavelength range of interest.

Figure 16B:
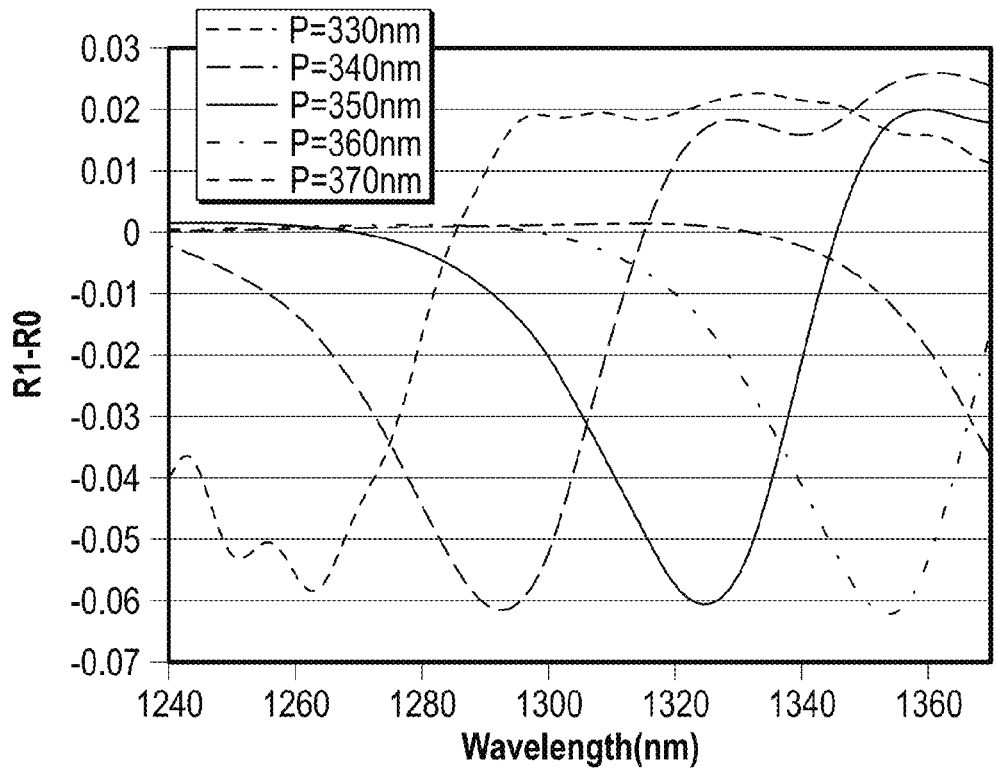
FIG. 16B includes an illustrative example showing a difference in the reflectance, due to the 1 nm thick refractive index perturbation of Δn=−0.5 in the n-Si immediately below the HfO$_2$ layer, as a function of wavelength and grating period (P), and in the cases shown in FIGS. 16A and 16B, the grating parameters were set to W=P/2 and H=90 nm, the Au film thickness to t=18 nm, and the HfO$_2$ thickness to d=2 nm.

FIG. 16B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=18 nm, grating bump height of H=90 nm, for several cases of grating period P over the range from P=330 to 370 nm, over the wavelength range of interest. Differential reflectances ($R_1-R_0$) of about 0.06 are achievable for several configurations following this example.

Example 8

SiO$_2$ was selected as the material for the insulator 140, Au was selected as the material for the metal film 130 and the grating bumps 150, $SiO_2$ was selected as the material for the thin insulator layer 120, n-type Si was selected as the material for the doped semiconductor 110, and a thin perturbative Si region 115 of permittivity $\epsilon'_{r,1}=(3.4767-0.5)^2$ and thickness 1 nm was used to model the index reduction caused by carrier accumulation in this region under an applied voltage (e.g., see FIGS. 4, 5A, and 5B).

The thickness t of the metal film 130 was varied from 14 to 22 nm, the grating bumps 150 were varied in height H from 60 to 120 nm, the grating bump width was set to W=P/2 (50% duty cycle), and the thickness d of the thin insulating layer 120 was taken as 2 nm, in order to illustrate the impact of these dimensions on the performance of the device. The free-space operating wavelength of operation was varied from $\lambda_0$=1240 to 1370 nm.

Figure 17A:
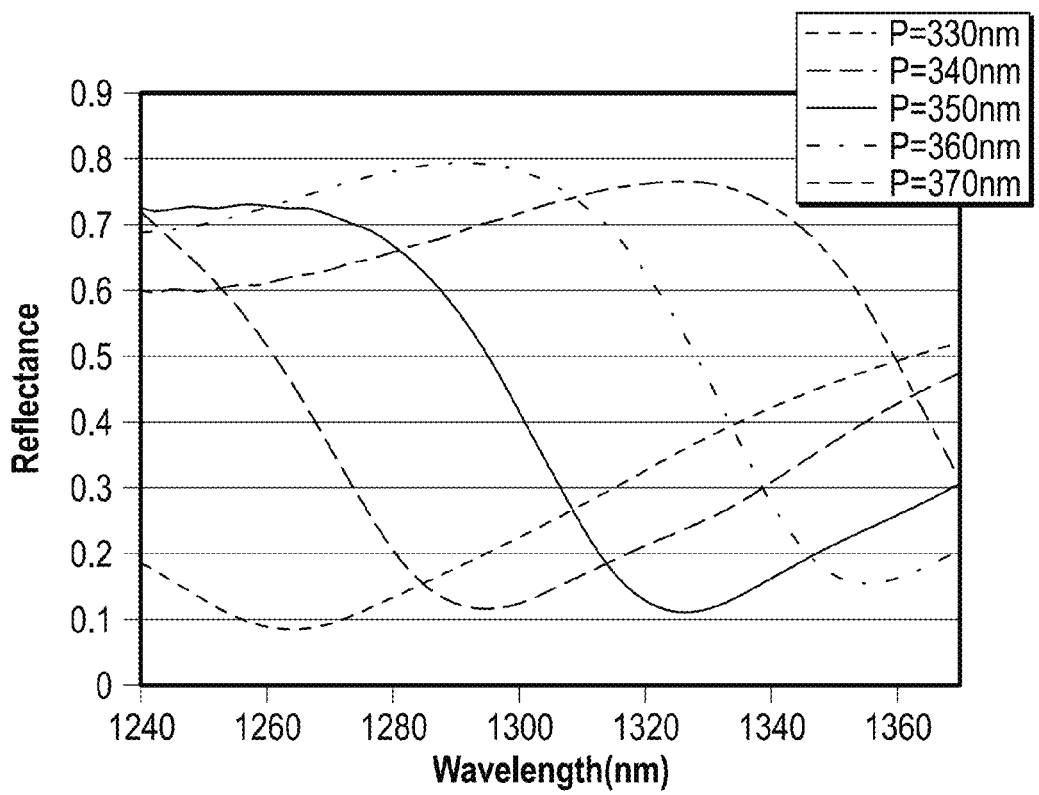
FIG. 17A includes an illustrative example showing a reflectance of Au grating couplers as a function of wavelength and grating period (P)

FIG. 17A gives the computed reflectance of the device without the thin perturbative region 115 for dimensions leading to a good differential reflectance ($R_1-R_0$), such as metal film thickness of t=18 nm, grating bump height of H=90 nm, for several cases of grating period P over the range from P=330 to 370 nm, over the wavelength range of interest.

Figure 17B:
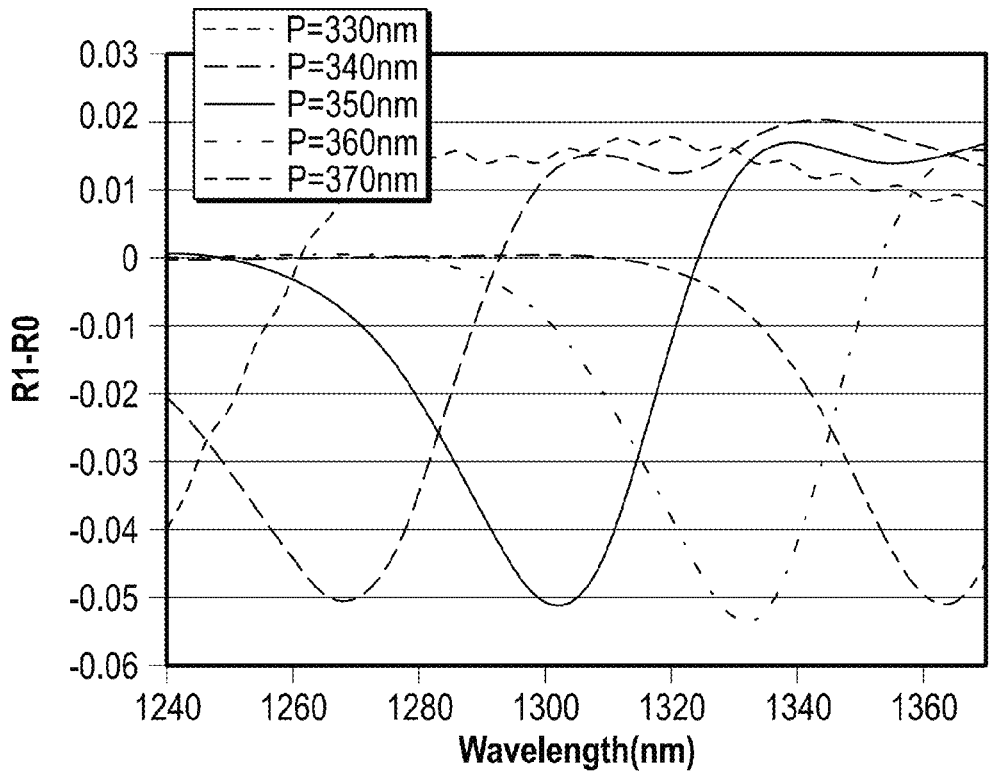
FIG. 17B shows the difference in the reflectance, due to the 1 nm thick refractive index perturbation of Δn=−0.5 in the n-Si immediately below the SiO$_2$ layer, as a function of wavelength and grating period (P) and in the cases of FIGS. 17A and 17B the grating parameters were set to W=P/2 and H=90 nm, the Au film thickness to t=18 nm, and the SiO$_2$ thickness to d=2 nm.
Figure 18A:
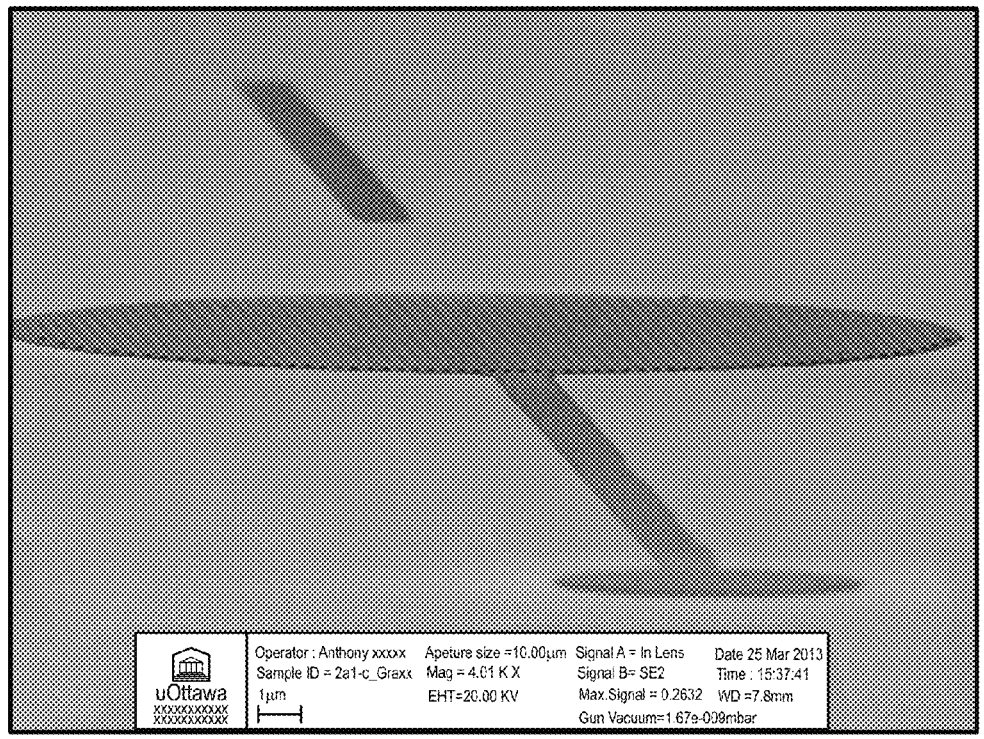
FIGS. 18A through 18D show illustrative examples including electron micrographs of a device such as shown in described in other examples elsewhere herein, fabricated for the purposes of demonstration, comprising Au grating bumps fabricated as stripes arranged in a period P=446.6 nm, duty cycle W/P=54%, and of height H=73 nm, on an Au metal film of thickness t=20 nm and diameter 25 μm, on a thin insulating SiO$_2$ layer of thickness d=2 nm, on n-type Si as the semiconductor material, with air as the cover region.
Figure 18B:
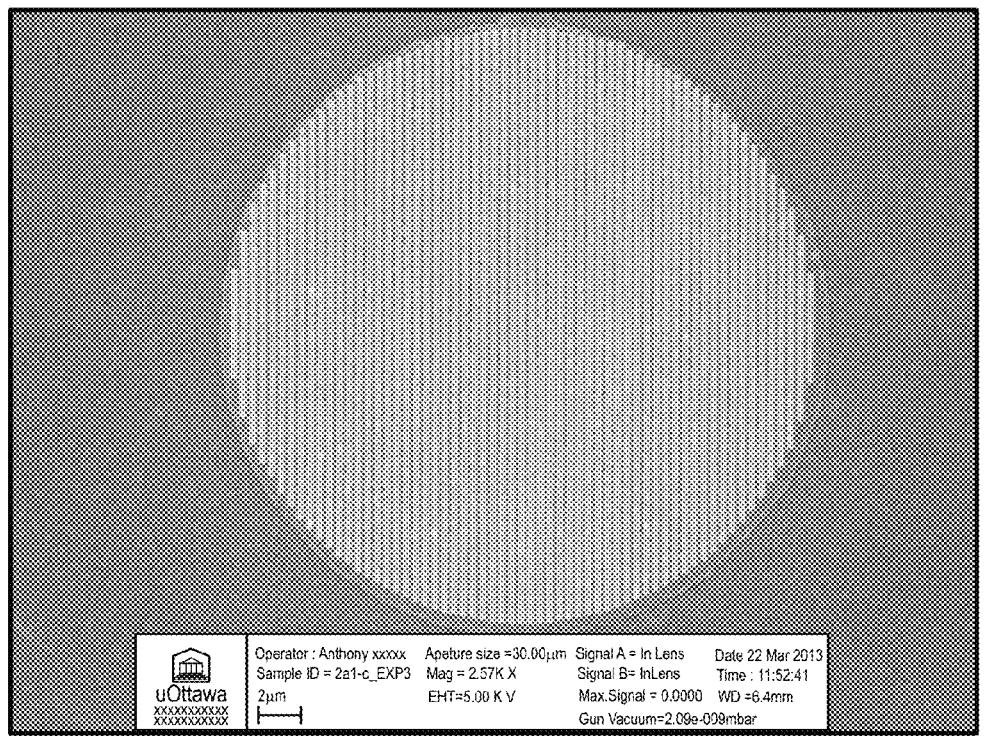
Figure 18C:
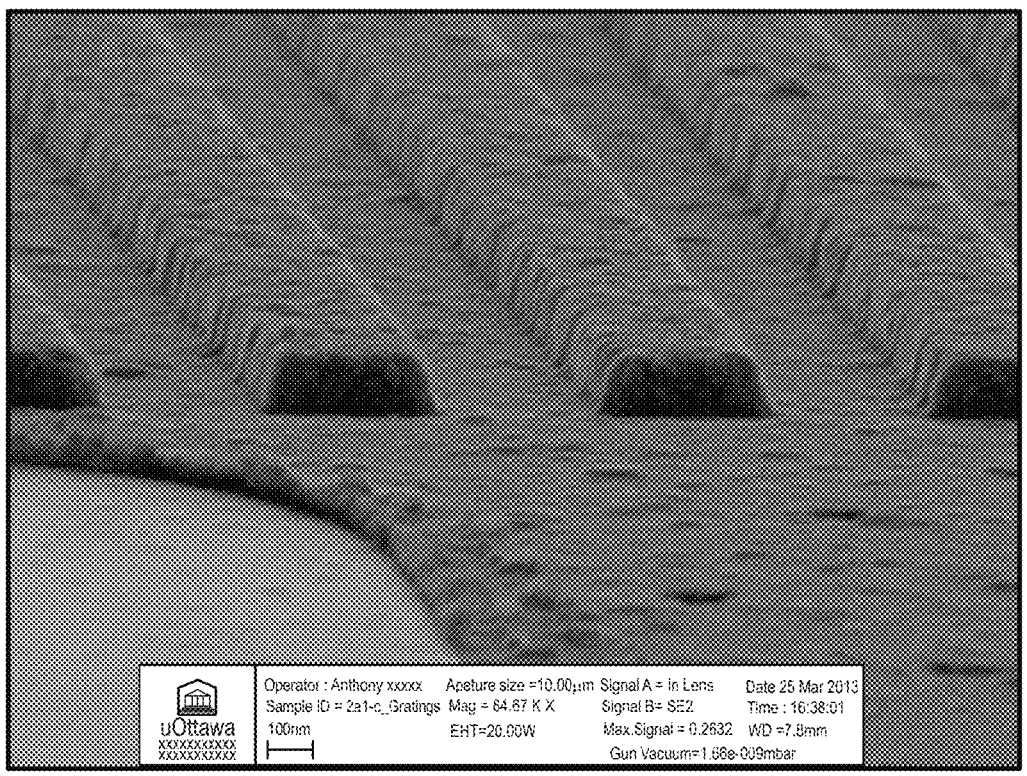
Figure 18D:
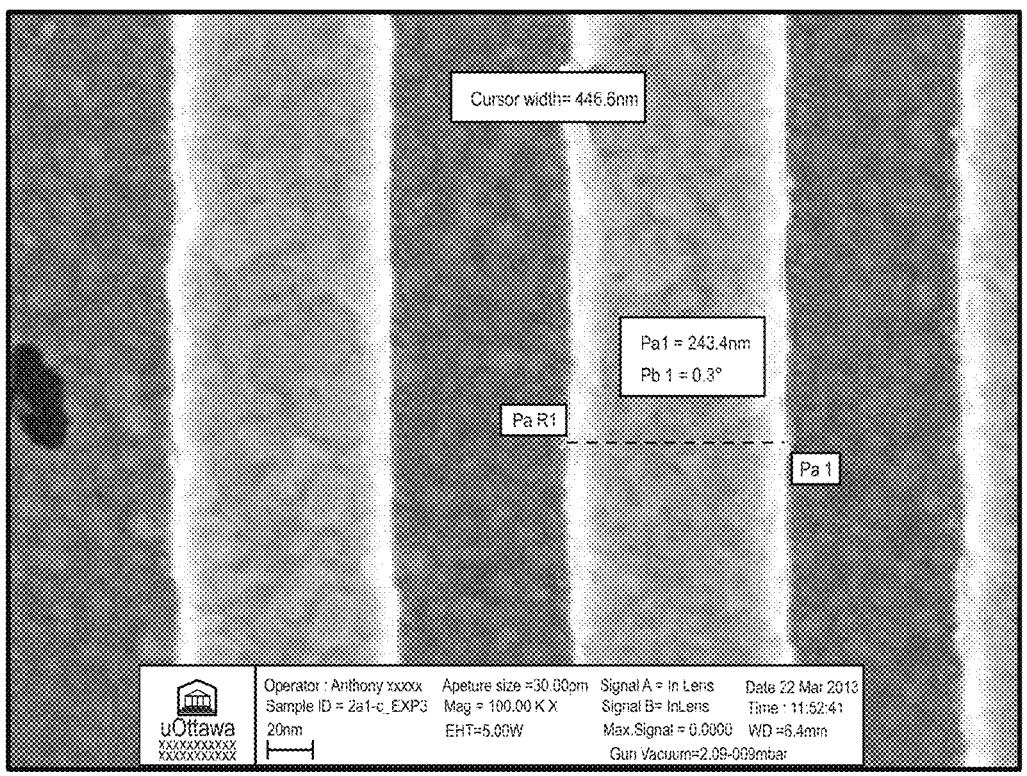

FIG. 17B gives the computed differential reflectance $R_1-R_0$ of the device without ($R_1$) and with ($R_0$) the thin perturbative layer 115, for dimensions leading to a good differential reflectance ($R_1-R_0$), such as metal film thickness of t=18 nm, grating bump height of H=90 nm, for several cases of grating period P over the range from P=330 to 370 nm, over the wavelength range of interest. Differential reflectances ($R_1-R_0$) of about 0.05 are achievable for several configurations following this example.

Example 9

FIGS. 18A to 18D show illustrative examples including scanning electron micrographs of a device such as shown in described in other examples elsewhere herein, comprising Au grating bumps 150 fabricated as stripes arranged in a period P=446.6 nm, duty cycle W/P=54%, and height H=73 nm, on a Au metal film 130 of thickness t=20 nm and diameter 25 μm, on a thin insulating $SiO_2$ layer 120 of thickness d=2 nm, on n-type Si as the semiconductor material 110, with air as the cover region 140. An Al Ohmic contact was fabricated on the bottom of the n-type Si material 110 to form the ground contact (FIG. 2), and a thin narrow Au stripe leading to a probe pad 10 μm in diameter, observable in FIG. 18A, was fabricated to apply voltages ($V_b$, $v_a(t)$) to the device. Fabrication of the device was carried out using generally-accepted wafer processing methods, including thermal growth of $SiO_2$, optical and electron-beam lithography, metal evaporation, and lift-off.

The sketch of FIG. 2 may be obtained by taking a cross-section through the center of the device in the direction perpendicular to the grating stripes. Given the invariance of the geometry along the grating stripes over a focused illumination beam that fits entirely on the structure, the 2-dimensional analyses discussed in the examples above can describe the performance of the device.

In an example, the device was illuminated at $\lambda_0$~1550 nm via a p-polarized Gaussian beam (electric field perpendicular to the grating stripes), focused to the center of the device, and a sinusoidal modulation voltage of about 3 V peak-to-peak was applied to the device with a DC offset of a few volts, producing intensity modulation in the reflected beam.

The electrical bandwidth of the device can be determined by RC time response. The capacitance of the device is defined by the area of the metal film 130 and the characteristics of the thin insulating layer 120. In an illustrative example, for a device film 130 area of 25 $\mu m^2$, and a d=4 nm thick insulating layer 120 of $SiO_2$, the capacitance is about 0.2 pF, and the electrical bandwidth is about 14 GHz for a 50Ω resistance connected in parallel with the device.

Fabrication techniques and experimentally-obtained results related to metal-insulator-semiconductor devices similar to those described herein can be found in S. Hassan, E. Lisicka-Skrzek, A. Olivieri, R. N. Tait and P. Berini, "Fabrication of a plasmonic modulator incorporating an overlaid grating coupler," Nanotechnology, Vol. 25, 495202 (2014), which is hereby incorporated by reference herein in its entirety.

Various Notes & Examples

Each of the non-limiting examples disclosed in this document can stand on its own, or can be combined in various permutations or combinations with one or more of the other examples. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In the context of this document, the term "optical radiation" can include electromagnetic waves having wavelengths in the infrared, visible and ultraviolet ranges. The terms "finite" and "infinite" need not be construed literally, but can be used figuratively, such as to distinguish between gratings and waveguides having "finite" widths in which the actual width can be significant to the performance of a structure and the physics governing its operation. By contrast, so-called "infinite" widths can refer to a physical width that is sufficiently large so that it has no significant effect upon the performance and physics of operation. Generally, according to such a description, dimensions that are said to be "optically infinite" or "optically semi-infinite" are so large that they can be insignificant to optical performance of a device.

The refractive index of a material can be denoted "n" and is generally related to a relative permittivity $\epsilon_r$ of the material, and can be represented as $\epsilon_r=n^2$. The relative permittivity $\epsilon_r$ is generally related to the absolute permittivity $\epsilon$, and can be represented as $\epsilon=\epsilon_r\epsilon_0$, where $\epsilon_0$ represents the absolute permittivity of free space or vacuum.

A material said to have a "high free (or almost free) charge carrier density" can be a material of a primarily metallic character exhibiting properties such as a high conductivity and a high optical reflectivity. Examples of such materials can include metals, semi-metals and highly doped semiconductors.

A material said to have a "low free (or almost free) charge carrier density" can be a material of a primarily dielectric character exhibiting properties such as a low conductivity.

Examples of such materials are (without limitation) insulators, dielectrics, and undoped or lightly doped semiconductors.

This specification refers to several published articles. For convenience, these articles are referenced in full in a numbered list at the end of the description and cited by number in the specification itself. The contents of these articles are incorporated herein by reference in their respective entireties.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An optical device, comprising:
    an electrically-conductive film layer coupleable to a first node of a bias circuit;
    an insulating layer coupled to a first surface of the electrically-conductive film layer;
    a semiconductor region coupled to the insulating layer, the semiconductor region coupleable to a second node of the bias circuit; and
    a plurality of grating bumps coupled to a second surface of the electrically-conductive film layer opposite the first surface, the plurality of grating bumps comprising a material having a relatively higher free charge carrier density as compared to the insulating layer;
    wherein the grating bumps are configured to couple optical energy having a wavelength in a specified range to the electrically-conductive film layer in a surface plasmon-polariton mode propagating along the electrically-conductive film layer including a field component that permeates the insulating layer and at least part of the semiconductor region.

2. The optical device of claim 1, wherein the grating bumps comprise an electrically-conductive material including at least one of a metal, a semi-metal, or a highly n- or p-doped semiconductor material.

3. The optical device of claim 1, wherein the electrically-conductive film layer comprises at least one of a metal, a semi-metal, or a highly n- or p-doped semiconductor.

4. The optical device of claim 1, wherein the electrically-conductive film layer comprises a single metal or a combination of metals.

5. The optical device of claim 1, wherein the electrically-conductive film layer comprises at least one of Cu or Al configured for integration into a silicon electronic wafer.

6. The optical device of claim 1, wherein the electrically-conductive film layer comprises at least one of Cu, Au, Ag, Al, or Cr, configured for an optical communication or biosensor application.

7. The optical device of claim 1, wherein the electrically-conductive film layer comprises a metal silicide.

8. The optical device of claim 1, wherein the electrically-conductive film layer comprises a semiconductor.

9. The optical device of claim 1, wherein the electrically-conductive film layer comprises at least one of TiN or TaN.

10. The optical device of claim 1, wherein the insulating layer comprises at least one of $HfO_2$, $SiO_2$, or $Si_3N_4$.

11. The optical device of claim 1, wherein the semiconductor region comprises n- or p-doped Si.

12. The optical device of claim 1, comprising a cover insulator including at least one of air, $SiO_2$, $Si_3N_4$, or PMMA.

13. The optical device of claim 1, further comprising the bias circuit; and
    wherein the electrically-conductive film layer is coupled to the first node of the bias circuit;
    wherein the semiconductor region is coupled to the second node of the bias circuit; and
    wherein the bias circuit is configured to apply a voltage between the first and second nodes.

14. The optical device of claim 13, further comprising a modulation circuit configured to apply a modulation signal to the first and second nodes including driving the optical device into a specified inversion or accumulation state in a time-varying manner to modulate a refractive index of the semiconductor region.

15. An electro-optical system, comprising:
    a bias circuit configured to apply a voltage between a first node and a second node; and an optical device, comprising:
- an electrically-conductive film layer coupled to the first node of the bias circuit;
- an insulating layer coupled to a first surface of the electrically-conductive film layer;
- a semiconductor region coupled to the insulating layer, the semiconductor region coupled to the second node of the bias circuit;
- a plurality of grating bumps coupled to a second surface of the electrically-conductive film layer opposite the first surface, the plurality of grating bumps comprising a material having a relatively higher free charge carrier density as compared to the insulating layer; and
- a cover insulator including at least one of air, $SiO_2$, $Si_3N_4$, or PMMA;
- wherein the grating bumps are configured to couple optical energy having a wavelength in a specified range to the electrically-conductive film layer in a surface plasmon-polariton mode propagating along the electrically-conductive film layer including a field component that permeates the insulating layer and at least part of the semiconductor region;
- wherein the insulating layer comprises at least one of $SiO_2$, $HfO_2$ and $Si_3N_4$, the grating bumps comprise at least one of Cu, Au, Ag, Al, Cr, TiN, TaN or a metal silicide, and the electrically-conductive film layer comprises at least one of Cu, Au, Ag, Al, Cr, TiN, TaN or a metal silicide.

16. A method of forming an optical device, comprising:
forming an electrically-conductive film layer coupleable to a first node of a bias circuit;
forming an insulating layer coupled to a first surface of the electrically-conductive film layer;
forming a semiconductor region coupled to the insulating layer, the semiconductor region coupleable to a second node of the bias circuit; and
forming a plurality of grating bumps coupled to a second surface of the electrically-conductive film layer opposite the first surface, the plurality of grating bumps comprising a material having a relatively higher free charge carrier density as compared to the insulating layer;
wherein the grating bumps are configured to couple optical energy having a wavelength in a specified range to the electrically-conductive film layer in a surface plasmon-polariton mode propagating along the electrically-conductive film layer including a field component that permeates the insulating layer and at least part of the semiconductor region.

17. The method of claim 16, wherein the insulating layer comprises at least one of $HfO_2$, $SiO_2$, or $Si_3N_4$.

18. The method of claim 16, wherein the semiconductor region comprises n- or p-doped Si.

19. The method of claim 16, comprising providing a cover insulator including at least one of providing an air-based cover insulator, or forming one or more of a $SiO_2$, $Si_3N_4$, or PMMA cover insulator.

20. The method of claim 16, wherein the grating bumps comprise an electrically-conductive material, and wherein the electrically-conductive film and the grating bumps include at least one of a metal, a semi-metal, or a highly n- or p-doped semiconductor material.

* * * * *